(12) United States Patent
Amanai et al.

(10) Patent No.: US 8,377,751 B2
(45) Date of Patent: Feb. 19, 2013

(54) METHOD FOR MANUFACTURING SEMICONDUCTOR DEVICE

(75) Inventors: Tomoji Amanai, Tokyo (JP); Toshiyuki Okabe, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 192 days.

(21) Appl. No.: 13/024,714

(22) Filed: Feb. 10, 2011

(65) Prior Publication Data

US 2011/0198739 A1    Aug. 18, 2011

(30) Foreign Application Priority Data

Feb. 12, 2010 (JP) ................... 2010-028705

(51) Int. Cl.
*H01L 21/00* (2006.01)

(52) U.S. Cl. ..................... 438/123; 257/667

(58) Field of Classification Search .......... 438/123; 257/667
See application file for complete search history.

(56) References Cited

U.S. PATENT DOCUMENTS 5,662,822 A * 9/1997 Tada et al. ............... 219/121.67
5,989,474 A * 11/1999 Suzuki ..................... 264/400
8,198,137 B2 * 6/2012 Heyl ........................ 438/111
2009/0223942 A1 * 9/2009 Heyl ..................... 219/121.69

FOREIGN PATENT DOCUMENTS

JP         4-157761        5/1992
JP       1996-316396      11/1996

* cited by examiner

*Primary Examiner* — Douglas Menz
(74) *Attorney, Agent, or Firm* — Womble Carlyle

(57) ABSTRACT

A semiconductor device manufacturing method prevents the occurrence of a short-circuit between leads caused by peeling-off of residual resin formed on lead side faces or lead lower portions. A laser beam is radiated a plurality of times from a main surface side of leads and also a plurality of times from a back surface side of the leads to intra-dam resin formed in a dam portion, the dam portion being enclosed with adjacent leads, a dam bar and a sealing body, thereby removing all the intra-dam resin formed on lead side faces and lead lower portions. The laser beam radiation of the intra-dam resin may leave behind a sealing body-side resin portion and a projecting resin portion which projects outwardly from the sealing body.

20 Claims, 16 Drawing Sheets

METHOD FOR MANUFACTURING SEMICONDUCTOR DEVICE

CROSS-REFERENCE TO RELATED APPLICATIONS

The disclosure of Japanese Patent Application No. 2010-28705 filed on Feb. 12, 2010 including the specification, drawings and abstract is incorporated herein by reference in its entirety.

BACKGROUND OF THE INVENTION

The present invention relates to a resin removing technique in a method for manufacturing a semiconductor device (or a semiconductor integrated circuit device).

In a semiconductor device wherein a semiconductor chip is mounted on a lead frame and is sealed together with the lead frame by resin molding, dam bars (tie bars) are each for coupling between leads of the lead frame and play the role of damming up molding resin flowing out between leads at the time of integrally sealing the lead frame and the semiconductor chip in the resin molding process.

The dam bars also play the role of reinforcing the leads. After sealing with the molding resin is over, the dam bars are cut off using, for example, a punch (cutting edge) and a die which are set in the interior of a press die (cutting die), whereby the leads of the lead frame are cut into individual leads from the state of being coupled together with the dam bars.

Japanese Unexamined Patent Publication No. Hei 4 (1992)-157761 (Patent Document 1) discloses, as a conventional tie bar cutting method, a technique wherein, using a punch and a die fitted precisely with the punch, which are set in the interior of a press die, a resin dam portion formed between a lead of a lead frame projecting from molding resin and another lead, as well as tie bar portion, are punched at a time. This publication also discloses a technique wherein a laser beam is radiated to the resin dam portion, allowing the resin of the dam portion to be melted and removed with the resulting heat, and thereafter the tie bar portion is cut off using the punch.

Japanese Unexamined Patent Publication No. Hei 8 (1996)-316396 (Patent Document 2) discloses a technique as a conventional method for manufacturing a resin-sealed semiconductor device wherein, using a lead frame having dam bars, intra-dam resin body formed between leads extending from a resin-sealed portion up to a dam bar, the intra-dam resin body having a thickness almost equal to that of each lead, is cut and removed together with the dam bar by means of a laser beam having a fine wedge-like spot.

According to a method for manufacturing a semiconductor device (or a semiconductor integrated circuit device) using a lead frame, in a process (resin sealing process, molding process) for forming a sealing body to seal a mounted semiconductor chip, there often is used a lead frame formed with dam bars (tie bars) as shown in Patent Documents 1 and 2 to prevent supplied resin from leaking to the outside of a device area on the lead frame.

After the resin sealing process, therefore, as shown in FIG. 1(a) and FIG. 3(a) of Patent Document 1, there is formed not only the main sealing body (chip sealing resin) for sealing the semiconductor chip but also a secondary sealing body (intra-dam resin, resin between leads) which is positioned around the semiconductor chip main sealing body in the area surrounded with leads exposed (projecting) from side faces of the main sealing body and dam bars.

In a dam cutting process after the resin sealing process, the dam bars and the intra-dam resin are removed and in a subsequent plating process a plating film as exterior plating is formed on each lead surface.

As a result of a study made by the present inventors about the method of removing the intra-dam resin in the dam cutting process, it turned out that the following problems were caused by the intra-dam resin removing method using a die punch (cutting edge) and by the methods disclosed in Patent Documents 1 and 2.

In case of removing a dam bar and intra-dam resin by punching with a die punch (cutting edge), the intra-dam resin can be removed together with the dam bar, as shown in FIG. 3(b) of Patent Document 1. However, as shown in FIG. 3(c) of Patent Document 1, a predetermined clearance taking a material tolerance and a cutting tolerance into account is provided between the area to be punched with the die punch and the leads adjacent thereto and the intra-dam resin remains partially on side faces of the leads, which is attributable to the presence of such clearance.

Moreover, in case of removing a dam bar and the intra-dam resin by radiation of a laser beam in accordance with the method disclosed in Patent Document 2, as shown in FIG. 23, resin residues $2i$ as residues of the intra-dam resin are formed on side faces of the associated lead 3 projecting from a side face $2c$ of a main sealing body 2. FIG. 23 is a plan view of a principal portion of a semiconductor device including a lead frame with a semiconductor chip mounted thereon, the lead frame being partially sealed with resin. FIG. 23 shows an area in which plural leads 3 as a portion of the lead frame are exposed partially from the side face $2c$ of the main sealing body 2.

Thus, with the resin residues $2i$ formed on side faces of each lead 3, there may occur the following inconveniences.

First, in a plating process for forming a plating film as exterior plating on surfaces of the leads 3 after the tie bar and intra-bar resin removing process, a plating solution no longer contacts the surfaces of the leads 3 due to intervention of the resin residues $2i$, so that a plating film is not formed on the surfaces of the leads 3 covered with the resin residues $2i$. Further, if the resin residues $2i$ fall off from the surfaces of the leads 3, the resin-removed portions are apt to undergo oxidation and corrosion because those portions are not formed with the plating film. As a result, when mounting the semiconductor device onto a package substrate by soldering, there occurs the problem that the leads 3 are not wetted by the solder.

In case of subjecting the leads 3 to a forming work after completion of the plating process, if lead forming is carried out with the resin residues $2i$ adhered to the surfaces of the leads 3 without falling off, a resin residue $2i$, due to a forming stress, may peel off from the surface (a side face) of a lead 3 and face toward another lead 3 adjacent to the lead 3 with which the resin residue was in contact. At this time, since the resin residue $2i$ is scarcely in close contact with the plating film, the plating film peels off from the environs of the resin residue $2i$, becomes an acicular (whisker-like, fine line-like) metal burr and faces toward another lead 3 adjacent to the lead 3 with which it was in contact, like the resin residue $2i$. If the metal burr of the plating film is longer than the distance between adjacent leads 3 and comes into contact with the lead 3 adjacent thereto or if metal burrs project from two leads 3 so as to face each other and come into contact with each other, this state leads to the problem of an electrical shorting (short-circuit) between the leads 3.

There also is a case where the resin residues $2i$ formed on side faces of the leads 3 shown in FIG. 23 peel off from the lead side faces and, in a dam cutting process for removing dam bars (not shown) and intra-dam resin (not shown) with use of a die punch, the resin residues 2*i* thus peeled off drop into a die which is for removing those dam bars and intra-dam resin. Likewise, there is a case where a resin residue 2*i* drops into a die which is for bending a lead 3 into a desired shape. In these cases, the dropped resin residue 2*i* may bite into the lead 3 and flaw the lead surface or cause damage to the punch or die set in the press die.

Moreover, if an attempt is made to remove the intra-dam resin by radiation of a laser beam having such high energy as permits removal of the intra-dam resin 2*f* shown in FIG. 25 in a single laser beam radiation, in accordance with the method disclosed in Patent Document 2, there arises the problem that the resin melted by the heat of the laser beam scatters around as a foreign matter and adheres to the surfaces of the leads 3 exposed from the main sealing body 2. This foreign matter is very small like soot, so even if the laser beam used in removing the intra-dam resin 2*f* is radiated to the surface of a lead 3, not only is it difficult to remove the foreign matter, but also there is a fear that the foreign matter may adhere as burnt deposit onto the surface of the lead 3. If the foreign matter adheres to the surface of the lead 3, a plating film is not stably formed on the surface of the lead 3 in the subsequent plating process, so that such reliability elements as wettability with solder and adhesion to the leads are deteriorated. There also is the problem that if a laser beam having such high energy is radiated, the lead frame surface is for example oxidized due to a high temperature, causing a change in quality of the lead frame, with consequent failure to form a plating film on the surface of each lead 3 in the subsequent plating process.

Moreover, in the method disclosed in Patent Document 1, a laser beam is radiated to the whole area of each dam portion 12*a* shown in FIG. 25, so if an attempt is made to remove all the resin present within the dam portion 12*a* without leaving any resin therein, high energy is required for the radiation of a laser beam. In this case, like the problem of the method disclosed in Patent Document 2, a plating film is no longer formed on the surface of each lead 3 because a foreign matter created upon laser beam radiation adheres to the lead 3 surface. Even if the radiation of a laser beam is performed in multiple bursts as is disclosed in Patent Document 1, it eventually provides energy high enough to remove all the intra-dam resin 2*f*, thus giving rise to the same problem as above.

The larger the quantity of the resin residues 2*i* formed on the surfaces of the leads 3, the easier the occurrence of short-circuit between adjacent leads 3. A description will be given below about in what mechanism the resin residues 2*i* formed on the surfaces of the leads 3 remain in a large quantity.

Usually, as shown in FIG. 24, in the case where a copper plate 30, which is set over a die 32 within a press die and under a die punch guide 33, is to be punched with a die punch (cutting edge) 31 to form a lead frame of the copper plate 30, an sacrificial copper plate portion 30*d* is punched with the punch in a direction from an upper surface 30*a* toward a lower surface 30*b* of the copper plate 30 (in the direction of arrow shown in FIG. 24). At this time, as a result of punching with the die punch 31, as shown in FIG. 24, a corner of the copper plate 30 which is a boundary between the upper surface 30*a* and a side face 30*c* of the copper plate 30 is pushed by the die punch 31 and is pulled in toward the lower surface 30*b* of the copper plate 30 by the sacrificial copper plate portion 30*d* being punched. Consequently, the height of the copper plate 30*d* becomes lower than that of the upper surface 30*a* as a flat surface of the copper plate 30, thus creating a shape having curvilinear depressions (recesses) 30*e*. On the other hand, a corner of the copper plate 30 which is a boundary between the lower surface 30*b* and a side face 30*c* of the copper plate 30 is pulled in toward the lower surface 30*b* of the copper plate 30 by the sacrificial copper plate portion 30*d* being punched with the die punch 31, thus creating a burr 30*f* projecting downwards with respect to the lower surface 30*b* as a flat surface of the copper plate 30.

As described above, the lead frame formed by the die punch 31 has the projecting burrs 30*f* at lower surface ends thereof. Usually, the lower surface having the burrs 30*f* is turned upwards and is used as a main surface of the lead frame, with a semiconductor chip being mounted on the main surface. The reason is that if the lead frame formed with the downward burrs 30*f* is used as is, then when the semiconductor device is mounted onto a package substrate, a part or the whole of the lead frame floats due to the burrs 30*f*, with consequent fear of causing a packaging defect of the semiconductor device.

Thus, the lead frame with a semiconductor chip mounted thereon has the burrs 30*f* on its main surface side and has the curvilinear depressions 30*e* at back-side corners. This is also true of the leads which are a portion of the lead frame. Main surface-side corners of the leads are formed with the burrs 30*f* and their back surface-side corners are formed with the curvilinear depressions 30*e*.

FIG. 25 is a plan view of the semiconductor device, showing a state wherein after mounting a semiconductor chip (not shown) onto the main surface of the lead frame and coupling the leads 3 with electrodes (not shown) on the semiconductor chip main surface electrically through bonding wires (not shown), the lead frame and the semiconductor chip were sealed with resin. Plural leads 3 exposed to the exterior from the main sealing body 2 are coupled together through dam bars 12. Within a dam portion 12*a* bordered by a dam bar 12, adjacent leads 3 and the main sealing body 2, intra-dam resin 2*f* is formed of the same material as the main sealing body 2.

FIG. 26 is a sectional view taken along line H-H in FIG. 25. As shown in FIG. 26, each lead 3 has burrs 30*f* on a main surface thereof and has depressions 30*e* on a back surface hereof. The intra-dam resin 2*f* located between adjacent leads 3 is formed in a state of getting in under the depressions 30*e* which have a curvilinear shape. This is because the surface of the die for forming the main sealing body 2 and the intra-dam resin 2*f*, which surface comes into contact with the back surface of the lead 3 having the depressions 30*e*, is flat, and when molding resin is poured into the die, it is intended for the molding resin to get into the clearance between the die having a flat surface and a lower surface of each depression 30*e* on the lead back surface to form the intra-dam resin 2*f*. Therefore, when a principal portion of the semiconductor device in FIG. 26 is seen from the back surface side, as shown in FIG. 27, the intra-dam resin 2*f* is formed on the surface of each back-side region of the lead 3 where the depression 30*e* (not shown) is formed. The intra-dam resin 2*f* is formed spreadedly to the lead 3 side or the dam bar 12 side with respect to the boundaries between side faces of each lead 3, as well as a side face of the associated dam bar 12, the side faces being indicated with broken lines in FIG. 27, and the intra-dam resin 2*f*. The intra-dam resin 2*f* formed on the back surface of each lead 3 covers the lead back surface in a wider range in the vicinity of the side face 2*c* of the main sealing body 2 than on the dam bar 12 side. In the direction along the side face 2*c* of the main sealing body 2, the back surface of each lead 3 is covered with the intra-dam resin 2*f* in a maximum range of about 100 µm (about 0.1 mm) from each of both ends. The width of each lead 3 in the direction along the side face 2*c* of the main sealing body 2 is about 300 µm (about 0.3 mm), so in the case where both ends of the back surface of the lead 3 are covered each about 100 μm with the intra-dam resin 2f in that direction, the width of the exposed lead 3 back surface is about 100 μm.

A lead frame (etching frame) 10d formed, not by punching with such a die punch 31 as shown in FIG. 24, but by exposing upper and lower surfaces of a copper plate with a resist film mask disposed thereon to a chemical has, in a sectional shape of a lead, projections 3i on a side face between the upper and lower surfaces of the lead frame as shown in FIG. 28. Therefore, in case of manufacturing the semiconductor device by using a lead frame 10d formed by etching, like a lead frame 10 formed by the die punch 31, in the resin sealing process of the lead frame 10d, intra-dam resin 2f is formed also above and below the projections 3i formed on a side face of each lead 3h.

In the case where the intra-dam resin 2f is removed by the intra-dam resin removing method using a die punch or by radiating a laser beam from the main surface side of leads 3 shown in FIG. 26 in accordance with the method disclosed in Patent Documents 1 and 2, even if the intra-dam resin 2f on a side face of the associated dam bar 12 and side faces of leads 3h is removed, the intra-dam resin 2f formed below the depressions 30e on the back surfaces of the leads 3 cannot be removed completely because the die punch or the laser beam does not come into contact with the intra-dam resin 2f formed below the depressions 30e on the leads' back surfaces.

Also in case of using the aforesaid etching frame as the lead frame, the laser beam or the die punch 31 from the main surface side does not come into contact with the intra-dam resin 2f formed below the projections 3i on side faces of the leads 3 shown in FIG. 28, thus making it impossible to remove the intra-dam resin 2f located below the projections 3i.

As described above, when a portion of the intra-dam resin 2f formed on side faces of the leads 3 or formed in lower portions of the leads 3 is not removed and resin residues 2i remain on the lead faces, the amount of resin formed on the lead faces becomes larger than in the case where each lead 3 is not formed with the depressions 30e and the side faces thereof are in contact perpendicularly with the main and back surfaces of the lead 3, with the side faces of the lead 3 being wholly perpendicular to the lead main surface. That is, in the case where the lead 3 is formed with the depressions 30e, it becomes easier for short-circuit to occur between adjacent leads 3, thus giving rise to a serious problem.

SUMMARY OF THE INVENTION

It is an object of the present invention to provide a technique for positively removing resin residues formed on a lead surface.

It is another object of the present invention to provide a technique for improving the reliability of a semiconductor device.

The above and other objects and noble features of the present invention will become apparent from the following description and the accompanying drawings.

In one aspect, the semiconductor device manufacturing method of the present invention is for manufacturing a semiconductor device having a main sealing body for sealing a semiconductor chip and a plurality of leads exposed from the main sealing body. The method includes the steps of:
(a) providing a semiconductor package including: the main sealing body for sealing the semiconductor chip; the leads exposed from the main sealing body; dam bars formed integrally with the leads; and a secondary sealing body formed in an area enclosed by the main sealing body, the leads and the dam bars;

(b) radiating a laser beam to the secondary sealing body to remove at least a portion of the secondary sealing body;
(c) after the step (b), removing a portion of the dam bars; and
(d) after the step (c), forming a plating film over each of the leads.

In the step (b) of the semiconductor manufacturing method of the present invention, which includes the above manufacturing steps, the laser beam is radiated to the secondary sealing body along a path extending along side faces of the leads and side faces of the dam bars, the side faces being in contact with the secondary sealing body.

Intra-dam resin formed on curvilinear portions of a back surface of each lead may thus be removed, thereby making it possible to improve the reliability of the semiconductor device.

DETAILED DESCRIPTION OF THE PREFERRED EMBODIMENTS

Figure 1:
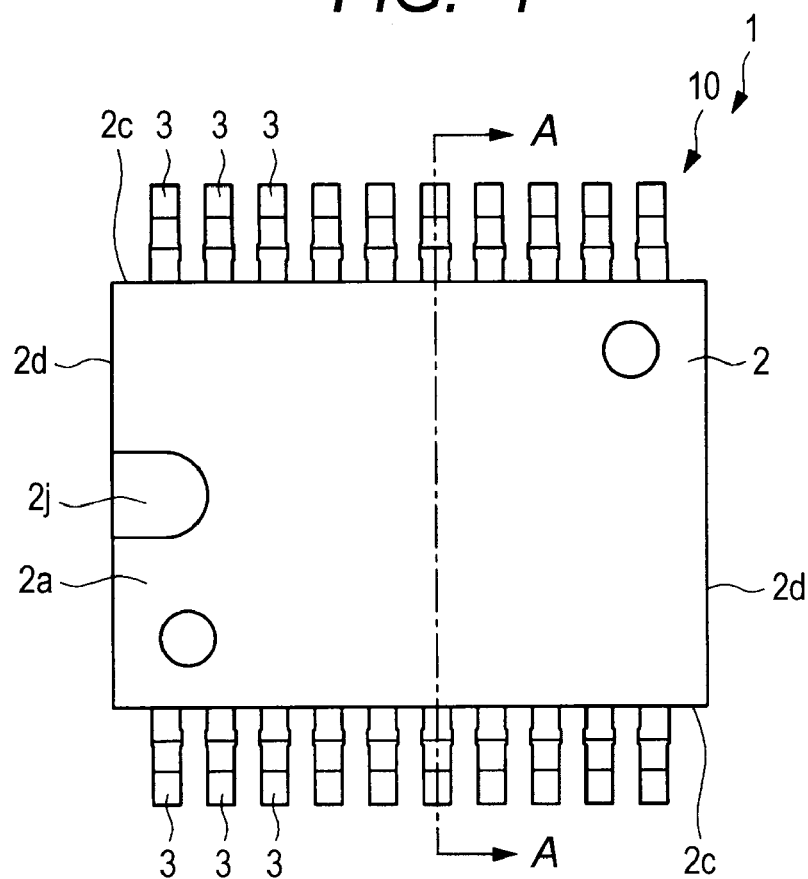
FIG. 1 is a plan view of a semiconductor device according to one embodiment of the present invention.

Where required for convenience' sake, the following embodiments will each be described over multiple figures.

In the following embodiments, when reference is made to a specific number of elements (including the number, numerical value, quantity and range), no limitation is made to the number referred to, but numbers above and below the number referred to will do as well unless otherwise mentioned and except the case where it is basically evident that limitation is made to the number referred to.

Moreover, it goes without saying that in the following embodiments their constituent elements are not always essential unless otherwise mentioned and except the case where they are obviously considered essential. Further, it goes without saying that in the following embodiments, "comprising A" when described in connection with a constituent element or the like does not exclude other elements except the case it is described clearly that limitation is made to only the element referred to.

Likewise, it is to be understood that when reference is made to the shapes and a positional relation of constituent elements in the following embodiments, those substantially closely similar to or resembling such shapes, etc. are also included unless otherwise mentioned and except the case where a negative answer is evident basically. This is also true of the foregoing numeral value and range.

When reference is made to the material or the like, the material specified is a principal material and does not exclude secondary elements, additives and additional elements unless otherwise mentioned and except the case where a negative answer is evident basically or in view of the situation. For example, unless otherwise mentioned, silicon material includes not only pure silicon but also added impurities and binary and ternary alloys (e.g., SiGe) containing silicon as a principal element.

In all the drawings for explaining the following embodiments, portions having the same functions are identified by the same reference numerals in principle, and repeated explanations thereof will be omitted.

An embodiment of the present invention is concerned with a semiconductor device wherein a semiconductor chip is mounted on a lead frame, the lead frame having leads (outer leads) projecting from a main sealing body and also having dam bars, and a part of the lead frame and the semiconductor chip are sealed with resin.

First, with reference to FIGS. 1 to 3, a description will be given about the configuration of the semiconductor device 1 of this embodiment. FIG. 1 is a plan view of the semiconductor device, indicated at 1, of this embodiment, FIG. 2 is a sectional view taken on line A-A of the semiconductor device 1 shown in FIG. 1, and FIG. 3 is a plan view showing on a larger scale a portion of leads 3 shown in FIG. 1.

As shown in FIG. 1, a planar shape of a main sealing body (sealing resin) 2 is generally quadrangular. More specifically, though not shown, corners of the main sealing body 2 are chamfered to suppress chipping of the sealing body. As shown in FIGS. 1 and 2, the main sealing body 2 has an upper surface 2a, a lower surface 2b located on the side opposite to the upper surface 2a, first side faces 2c positioned between the upper surface 2a and the lower surface 2b, and second side faces 2d positioned between the upper surface 2a and the lower surface 2b and intersecting the first side faces 2c perpendicularly.

Figure 2:
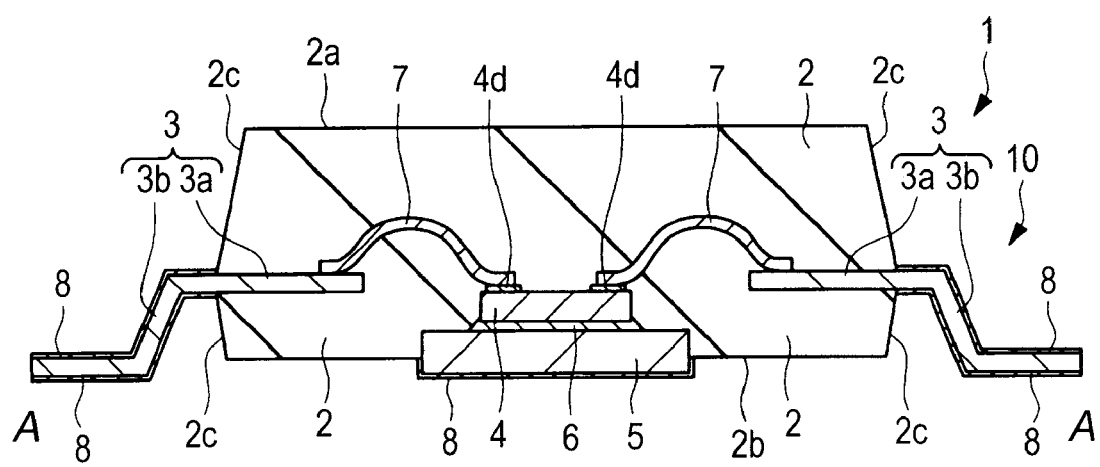
FIG. 2 is a sectional view taken along line A-A in FIG. 1.
Figure 3:
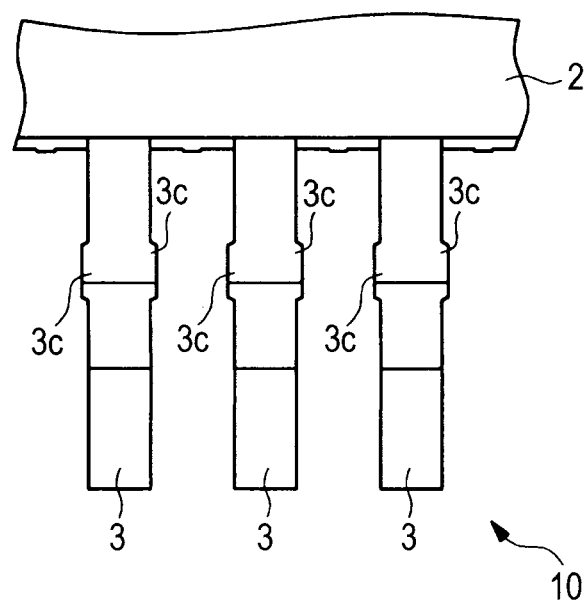
FIG. 3 is a plan view showing on a larger scale a portion of leads shown in FIG. 1.

As shown in FIGS. 1 and 2, plural leads 3 as external terminals are exposed from the first side faces 2c of the main sealing body 2 (one of the four sides and another side located opposite thereto in the semiconductor device 1 of FIG. 1). More specifically, the leads 3 formed along the first side faces 2c of the main sealing body 2 partially project outwards from the first side faces 2c of the main sealing body 2, as shown in FIGS. 1 and 2, and outside the main sealing body 2 they are bent from the upper surface 2a side of the main sealing body 2 toward the lower surface 2b. In the direction along the first side faces 2c of the main sealing body 2 the width of each lead 3 is about 300 μm (about 0.3 mm), and in the direction intersecting a main surface of each lead 3 the thickness of each lead 3 is about 200 μm (about 0.2 mm) Each lead 3 includes an outer lead 3b located outside the sealing body 2 and an inner lead 3a sealed partially with the sealing body.

On the upper surface 2a of the main sealing body 2 is formed a mark (alignment mark, position recognizing mark) 2j for recognizing the first one of the leads 3, as shown in FIG. 1.

As shown in FIG. 2, a semiconductor chip 4 is disposed in the interior of the main sealing body 2. The semiconductor chip 4 is mounted through a die bonding material (adhesive) 6 onto a main surface of a chip mounting portion (die pad, tab) 5 which is also disposed in the interior of the main sealing body 2. A lower surface of the chip mounting portion 5 protrudes from the lower surface 2b of the main sealing body 2. However, in some embodiments, the chip mounting portion 5 does not protrude from the lower surface 2b of the main sealing body 2.

Plural electrode pads (bonding pads) 4d formed on a main surface of the semiconductor chip 4 are coupled electrically through a plurality of conductive members 7 to the inner leads 3a respectively which are positioned in the interior of the main sealing body 2. The conductive members 7 used in this embodiment are bonding wires formed of gold (Au) for example. The conductive members 7 are also sealed with the main sealing body 2 and are thus protected electrically and mechanically. Further, a plating film 8 is formed on the surface of each lead 3 projected from the main sealing body 2, as shown in FIG. 2. As the conductive members 7 there may be used wires formed of copper (Cu) or aluminum (Al) or metallic ribbons formed of copper or aluminum.

As shown in FIG. 3, each of the leads 3 positioned outside the main sealing body 2 has protuberances 3c formed on side faces of the lead 3 (long sides of the lead 3 in FIG. 3). The protuberances 3c correspond to residual dam bars resulting from cutting dam bars (tie bars) formed on the lead frame. Therefore, the protuberances (residual dam bars) 3c formed on each of the leads 3 are formed so as to face the protuberances 3c formed on adjacent leads 3.

In the plan views of FIGS. 1 and 3, the plating film 8 formed on the surface of each lead 3 is not shown so as to facilitate understanding of the illustrated structures.

Next, with reference to FIGS. 4 to 20, a description will be given below about a manufacturing process for the semiconductor device 1 of this embodiment.

Figure 4:
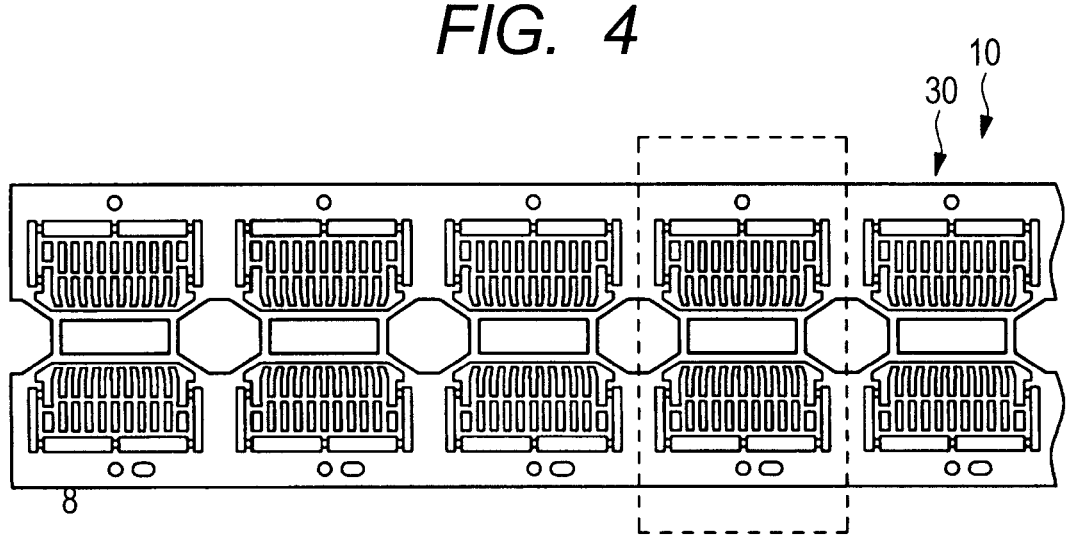
FIG. 4 is a plan view illustrating manufacturing steps for the semiconductor device according to the embodiment.
Figure 5:
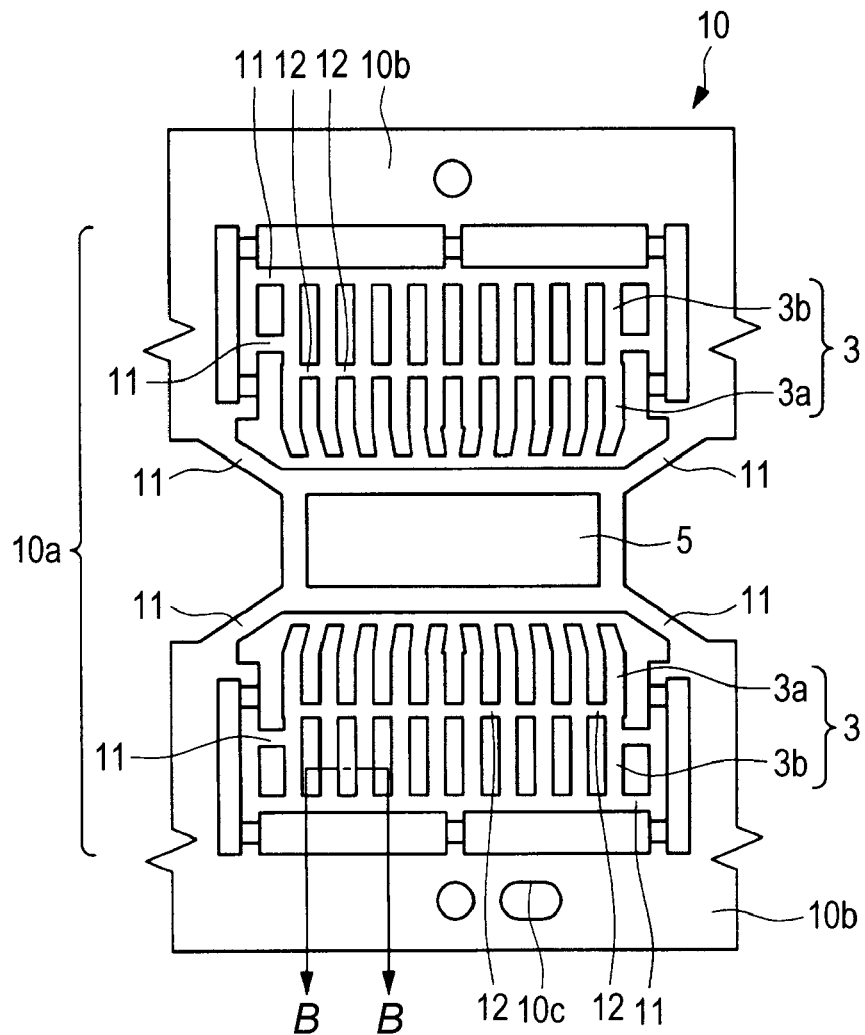
FIG. 5 is a plan view showing a part of FIG. 4 on a larger scale.

First, as shown in FIGS. 4 and 5, a copper plate 30 formed of Cu (copper) is provided and sacrificial portions of the copper plate are punched off using a die punch to form the lead frame 10 of the copper plate 30. FIG. 4 is a plan view showing the semiconductor device being manufactured and FIG. 5 is a plan view showing a broken line area of FIG. 4 on a larger scale. After the copper plate 30 is punched from an upper surface toward a lower surface of the copper plate by means of a die punch, upper and lower surfaces of a lead frame 10 formed thereby are inverted. Then, in a subsequent step, the lead frame 10 is used in a state in which the surface having been a lower surface of the copper plate 30 is turned up as a main surface of the lead frame 10, while the surface having been an upper surface of the copper plate 30 is turned down as a back surface of the lead frame 10. By so doing, burrs which were formed in a direction from the upper surface toward the lower surface of the copper plate 30 at the time of punching the copper plate with the die punch are turned upward, so that it is possible to prevent the occurrence of a packaging defect of the semiconductor device which is caused by floating of a part or the whole of the lead frame 10 when mounting the semiconductor device onto a package substrate.

As shown in FIG. 5, plural device areas 10a are formed inside a frame (frame portion) 10b of the lead frame 10 used in this embodiment. The lead frame 10 is comprised of a copper plate 30 which is long in one direction as in FIG. 4 and multiple instances of the device area 10a shown in FIG. 5 are formed side by side in the extending direction of the copper plate 30. That is, inside the frame 10b, the device areas 10a are formed in a row in one direction, but in FIG. 5 there is shown only one of the device areas 10a. Feed holes (sprocket holes) 10c for conveyance of the lead frame 10 are formed in the frame 10b.

Each device area 10a has a chip mounting portion (die pad, tab) 5 formed nearly centrally of the device area 10a and plural suspending leads 11 formed integrally with the chip mounting portion 5. Each device area 10a includes plural leads 3 disposed between the suspending leads 11 and around the chip mounting portion 5 and further includes dam bars (tie bars) 12 formed integrally with the leads 3.

Each of the leads 3 is partially covered with a sealing body (see FIGS. 1 and 2) which is formed in a later sealing step. As shown in FIG. 5, each lead 3 includes an inner lead 3a which is positioned on the chip mounting portion 5 side with respect to the associated dam bar 12 and an outer lead 3b formed at a position more distant from the inner lead 3a than the dam bar 12.

Though not shown, a plating film of silver (Ag) is formed on a surface of an end portion (a portion to which a wire is coupled in a later wiring step) of the inner lead 3a close to the chip mounting portion 5. An electrolytic plating method is used to form the plating film in this embodiment. Though not shown, after the lead frame 10 is formed, a nickel (Ni) film is formed by plating on the surface of the copper lead frame 10.

Although in this embodiment copper is used as the material of the lead frame 10, one may instead use an alloy of iron (Fe) and nickel (Ni). The thickness (spacing between upper and lower surfaces of each lead 3) of the lead frame 10 in this embodiment is about 200 μm (about 0.2 mm)

Figure 6:
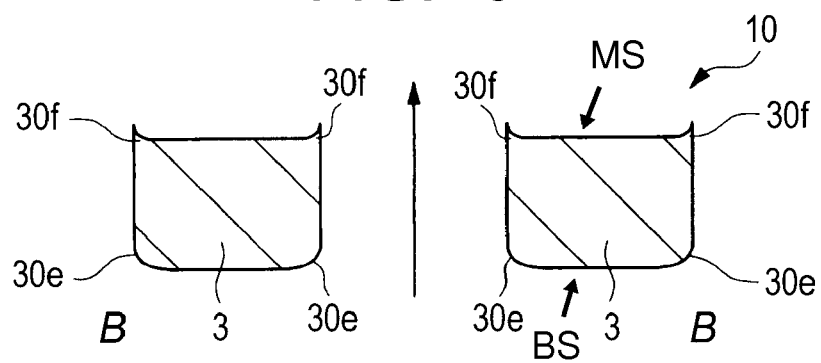
FIG. 6 is a sectional view taken on line B-B in FIG. 5.
Figure 24:
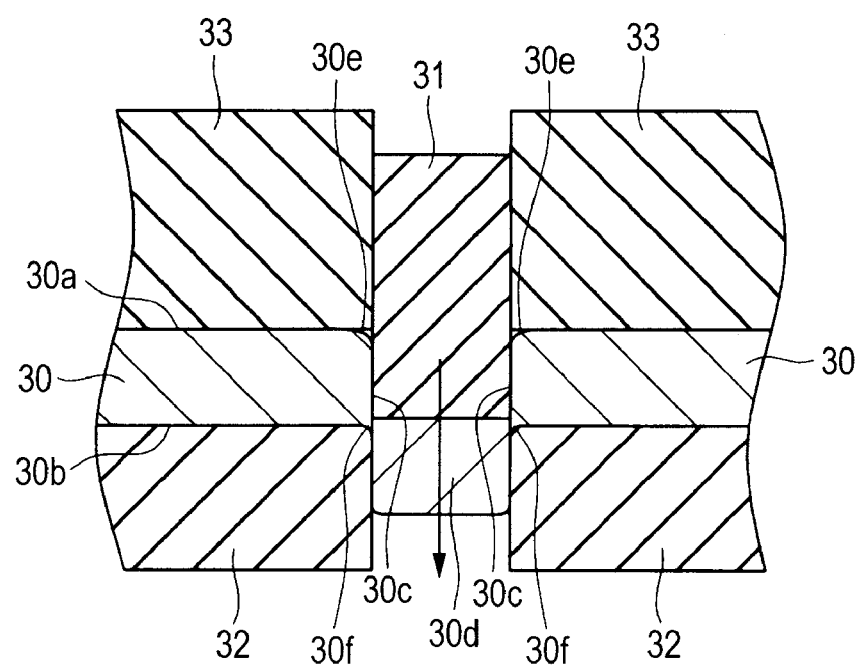
FIG. 24 is a sectional view of a principal portion, illustrating a semiconductor device manufacturing method.
Figure 25:
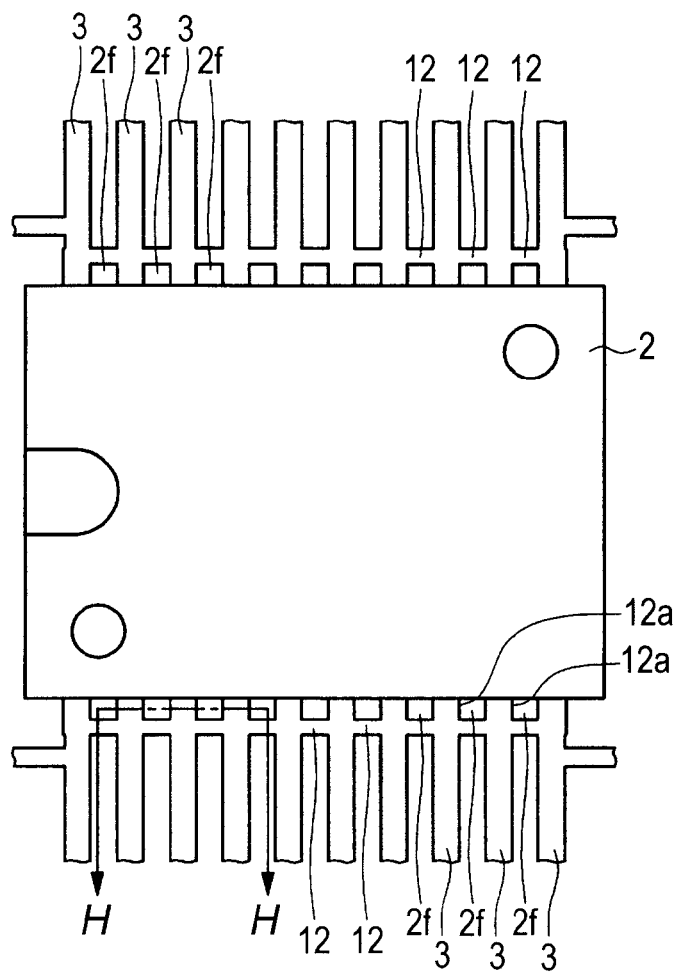
FIG. 25 is a plan view illustrating a semiconductor device manufacturing method.
Figure 26:
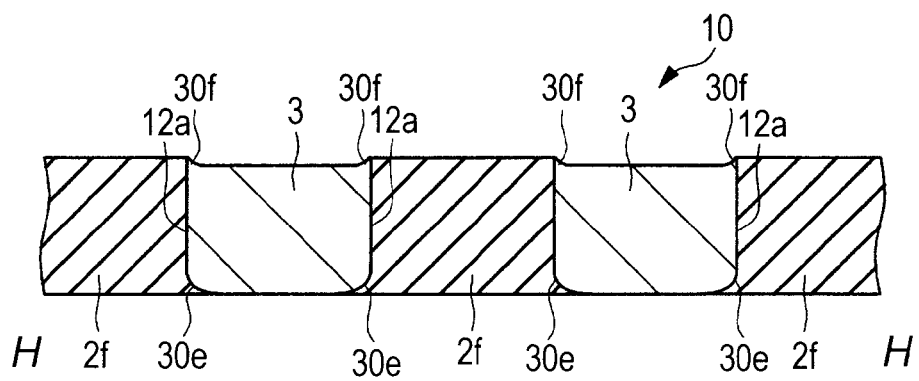
FIG. 26 is a sectional view taken on line H-H in FIG. 25.
Figure 27:
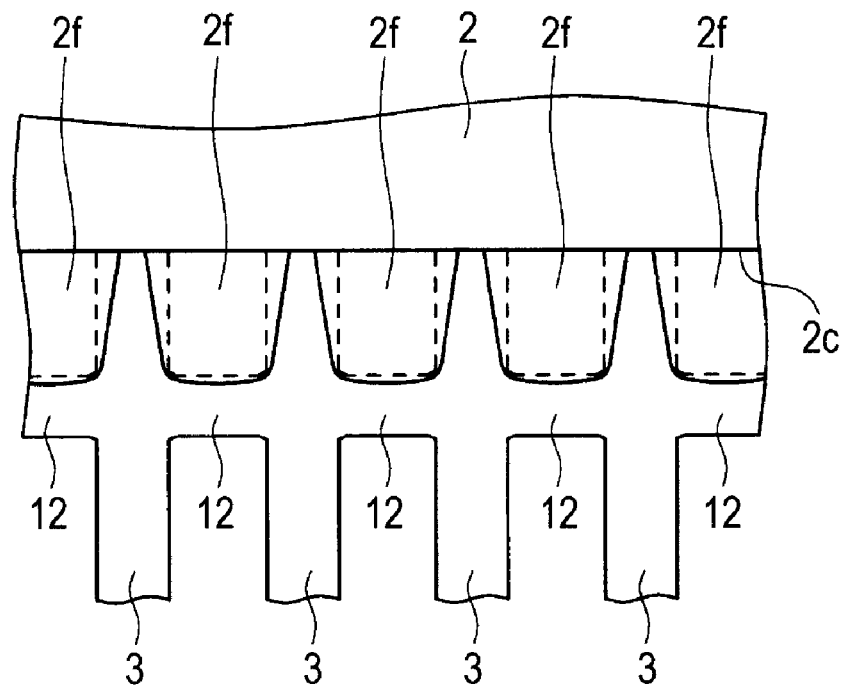
FIG. 27 is a back view illustrating a semiconductor device manufacturing method.

FIG. 6 is a sectional view taken on line B-B in FIG. 5. FIG. 6 shows a section of each lead 3 (the outer lead 3b portion) which is in an area that is more distant from the chip mounting portion 5 than the associated dam bar 12. As shown in FIG. 6, end portions of the back surface of the lead frame 10 including the leads 3 have curvilinearly recessed depressions 30e, with corners being rounded. This is for the following reason. As explained previously in connection with FIG. 24, sacrificial copper plate portions 30d are punched off by the die punch 31. At this time, the copper plate 30 is cut a direction which results in the corners being pulled toward the main surface MS of the lead frame 10 by both the sacrificial copper plate portions and die punch 31, so that the surfaces of the end portions of the lead frame back surface BS rise toward the main surface side of the lead frame 10, thus affording a shape having the curvilinear depressions 30e. In FIG. 6, the direction in which the sacrificial copper plate portion 30d was punched off by the die punch 31 is indicated by an arrow.

Moreover, as shown in FIG. 6, upwardly projecting burrs 30f are formed at end portions respectively of the main surface of the lead frame 10. This is for the following reason. As explained previously in connection with FIG. 24, the copper plate 30 is cut in an upwardly pulled state with respect to the main surface of the lead frame 10 by the sacrificial copper plate portion 30d which is punched from the back surface side to the main surface side of the lead frame 10 by means of the die punch 31, and assumes a shape projecting more upwards than the main surface of the lead frame 10.

Figure 7:
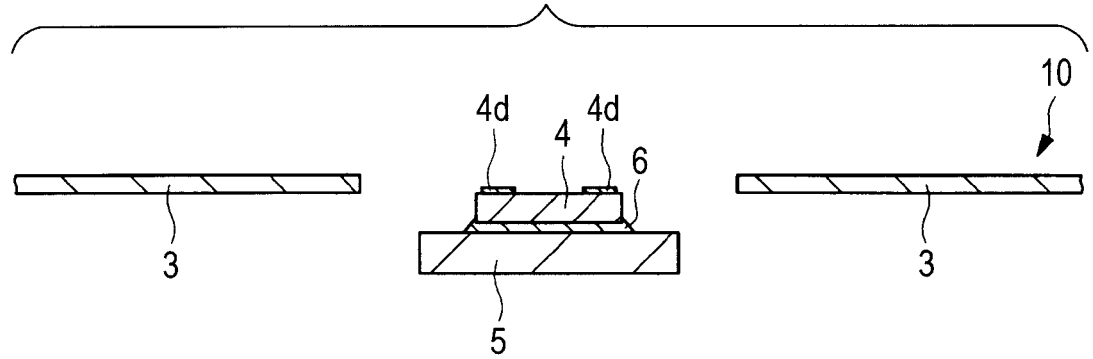
FIG. 7 is a sectional view illustrating the semiconductor device manufacturing method which follows FIG. 5.

Next, as shown in FIG. 7, after the foregoing lead frame 10 and semiconductor chip 4 have been provided, the semiconductor chip 4 is mounted through a die bonding material 6 onto an upper surface of a chip mounting portion 5. The die bonding material 6 used in this embodiment is a pasty adhesive. It is disposed (applied) onto the upper surface of the chip mounting portion 5 through a nozzle (not shown) for example and thereafter the semiconductor chip 4 is mounted. FIG. 7 is a sectional view of the semiconductor device being manufactured, including leads 3 and the semiconductor chip 4. In FIG. 7, the frame 10b seen in FIG. 5 is not shown. Although in the illustrated example the semiconductor chip 4 is mounted onto the chip mounting portion 5 through the pasty die bonding material 6, an adhesive layer, e.g., DAF (Die Attach Film), may be affixed to a back surface of the semiconductor chip 4 and the semiconductor chip may be mounted onto the chip mounting portion 5 through the adhesive layer.

Figure 8:
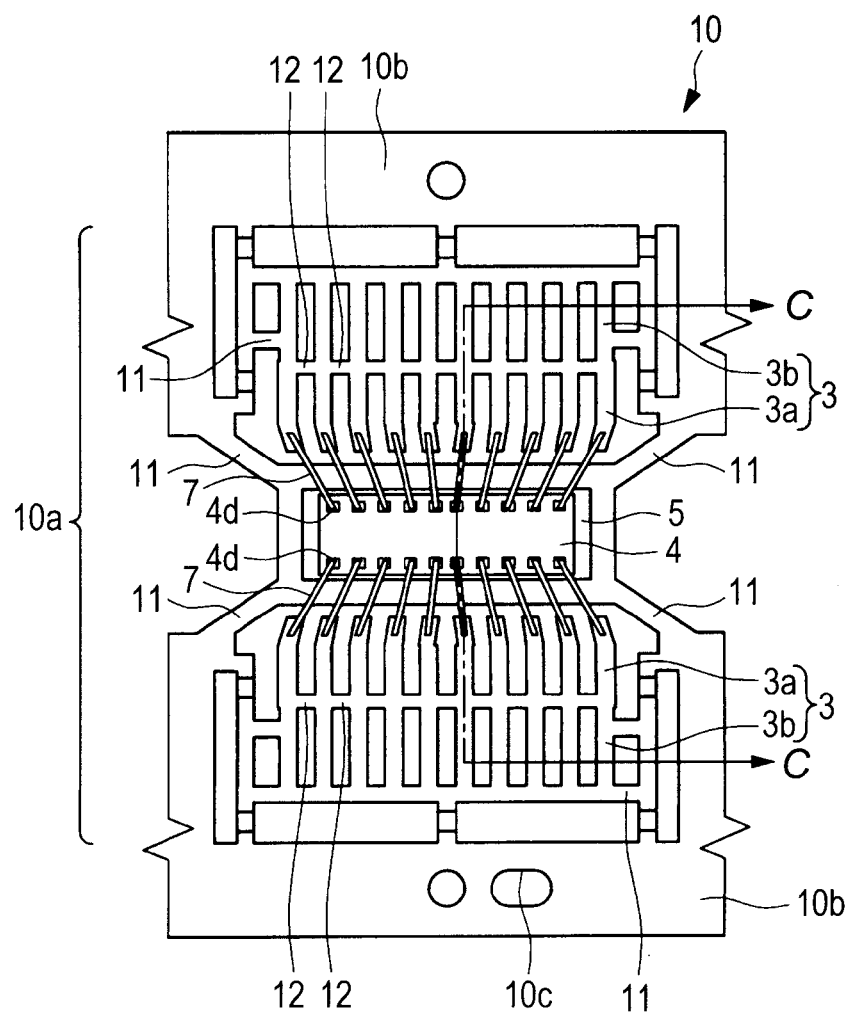
FIG. 8 is a plan view illustrating the semiconductor device manufacturing method which follows FIG. 7.
Figure 9:
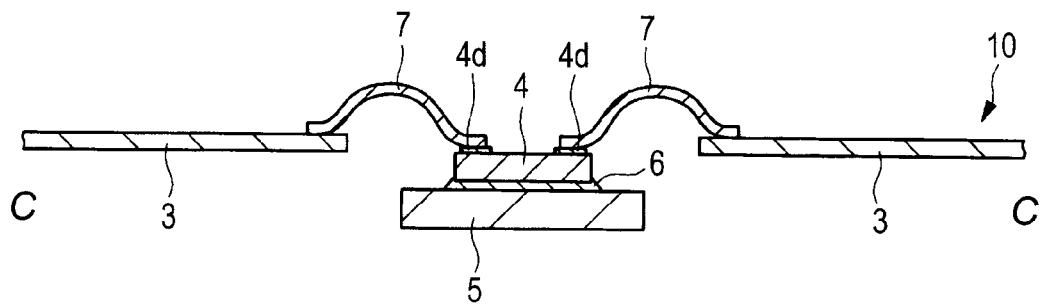
FIG. 9 is a sectional view taken on line C-C in FIG. 8.

Next, as shown in FIGS. 8 and 9, electrode pads 4d formed on the main surface of the semiconductor chip 4 and the leads 3 are coupled together electrically through conductive members 7. FIG. 8 is a plan view showing the lead frame 10 with the semiconductor chip 4 mounted thereon and FIG. 9 is a sectional view taken on line C-C in FIG. 8. Bonding wires as the conductive members 7 are formed of, say, gold (Au) in this embodiment. Therefore, by forming gold (Au) beforehand on surfaces of the electrode pads 4d it is possible to improve the adhesion between the wires and the electrode pads 4d. In FIG. 9 and subsequent figures, illustration of the frame 10b shown in FIG. 5 is omitted.

Figure 10:
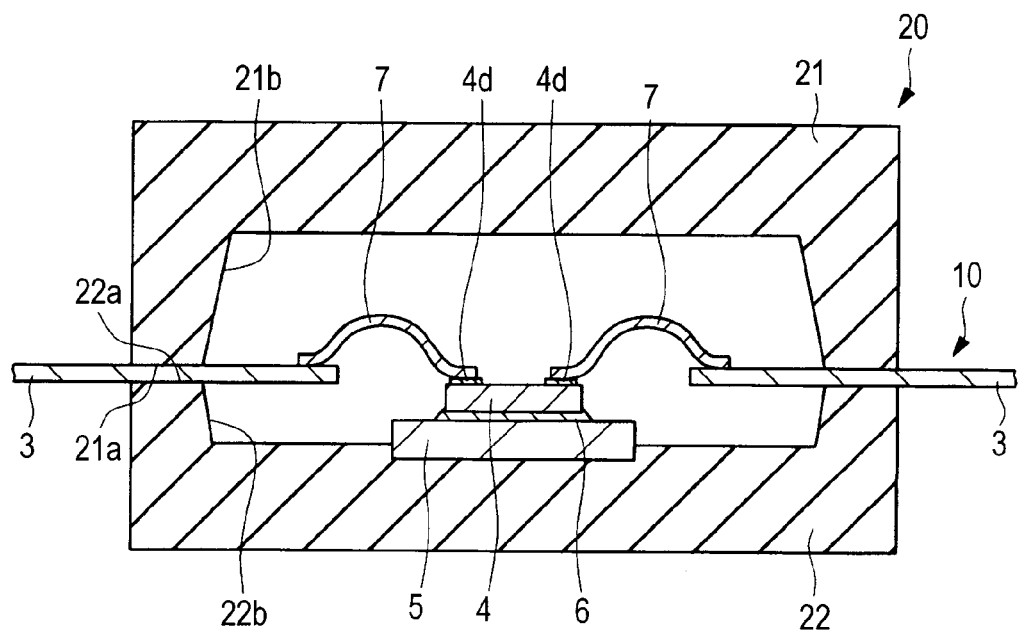
FIG. 10 is a sectional view illustrating the semiconductor device manufacturing method which follows FIG. 9.

Next, as shown in FIG. 10, there are provided an upper mold (first mold) 21, the upper mold 21 having a mold surface (first mold surface) 21a and an upper cavity 21b formed in the mold surface 21a, and a lower mold (second mold) 22, the lower mold 22 having a mold surface (second mold surface) 22a opposed to the mold surface 21a and a lower cavity 22b formed in the mold surface 22a.

Thereafter, the lead frame 10 having gone through the wire bonding step is disposed in the interior (between the upper mold 21 and the lower mold 22) of a molding die 20 in such a manner that the chip mounting portion 5 is positioned within the cavity 22b of the lower mold 22.

Figure 11:
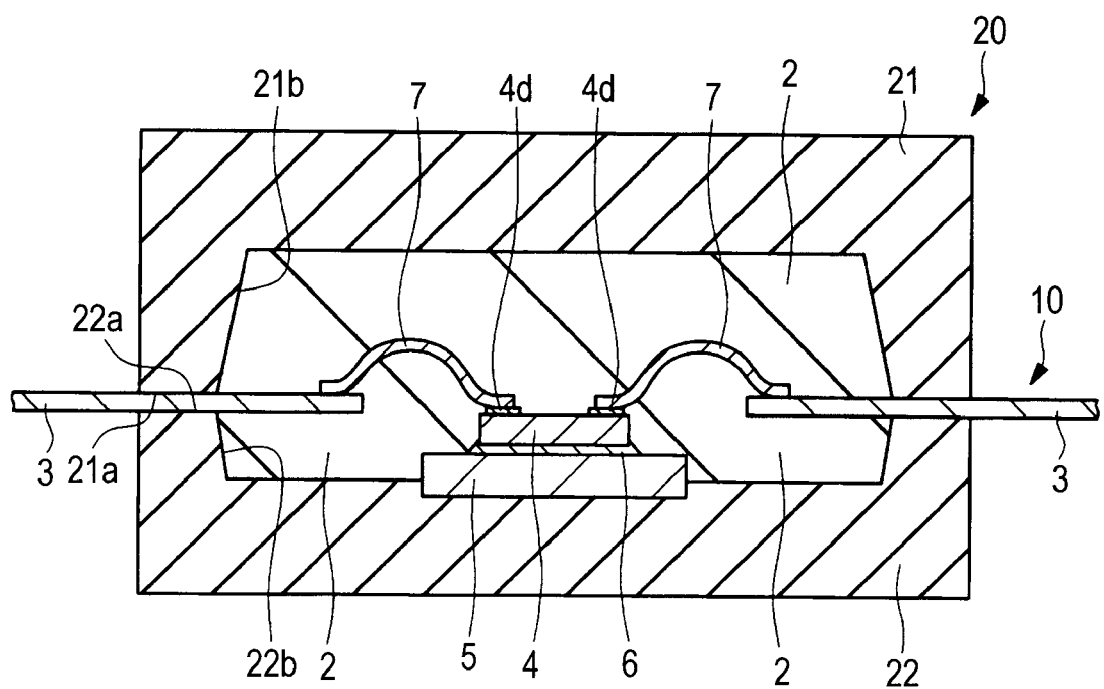
FIG. 11 is a sectional view illustrating the semiconductor device manufacturing method which follows FIG. 10.

Next, as shown in FIG. 11, with the lead frame 10 clamped by both upper mold 21 and lower mold 22, resin is fed into each of the upper cavity 21b of the upper mold 21 and the lower cavity 22b of the lower mold 22, thereby sealing the semiconductor chip 4, conductive members 7, chip mounting portion 5 and leads 3 with the resin.

Thereafter, the fed resin is heat-cured to form a main sealing body (chip sealing resin) 2. The resin which forms the main sealing body in this embodiment is a thermosetting epoxy resin and contains plural fillers (silica). The temperature of the molding die 20 in this embodiment is about 180° C.

Figure 12:
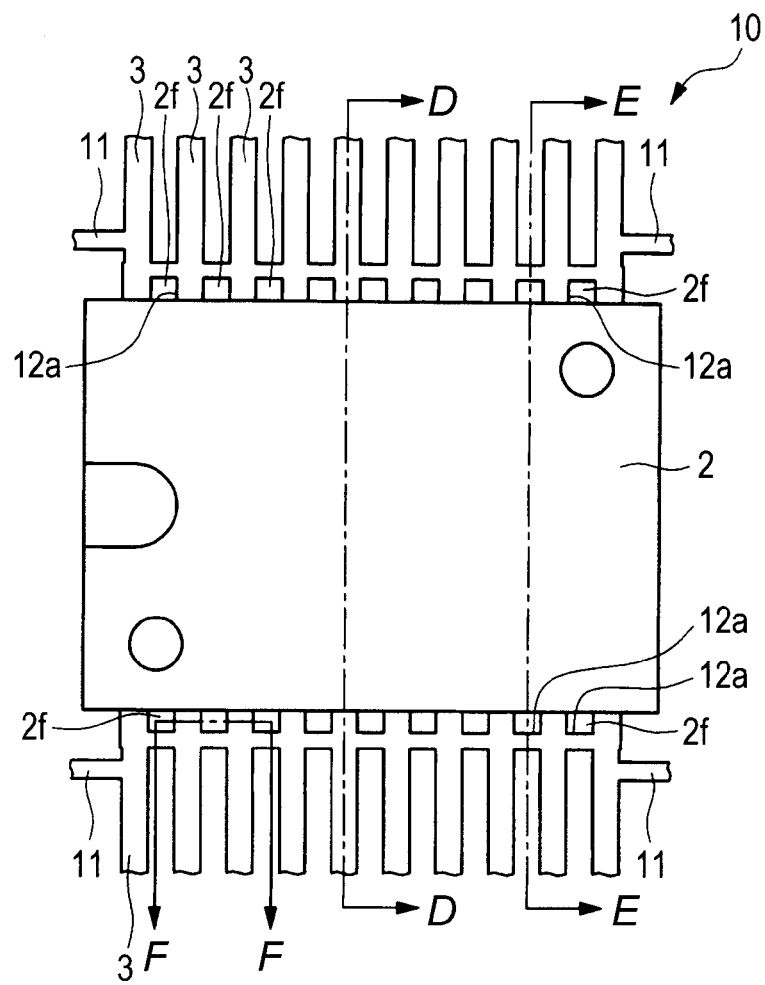
FIG. 12 is a plan view illustrating the semiconductor device manufacturing method which follows FIG. 11.
Figure 13:
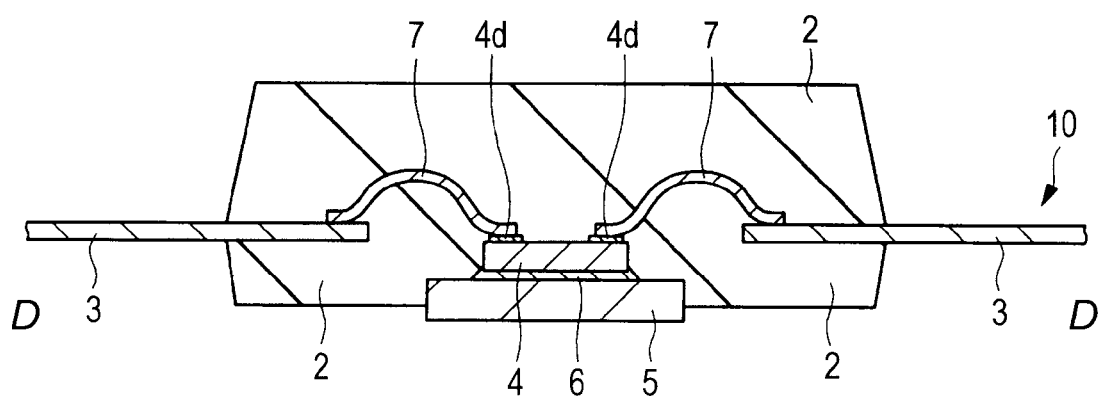
FIG. 13 is a sectional view taken on line D-D in FIG. 12.
Figure 14:
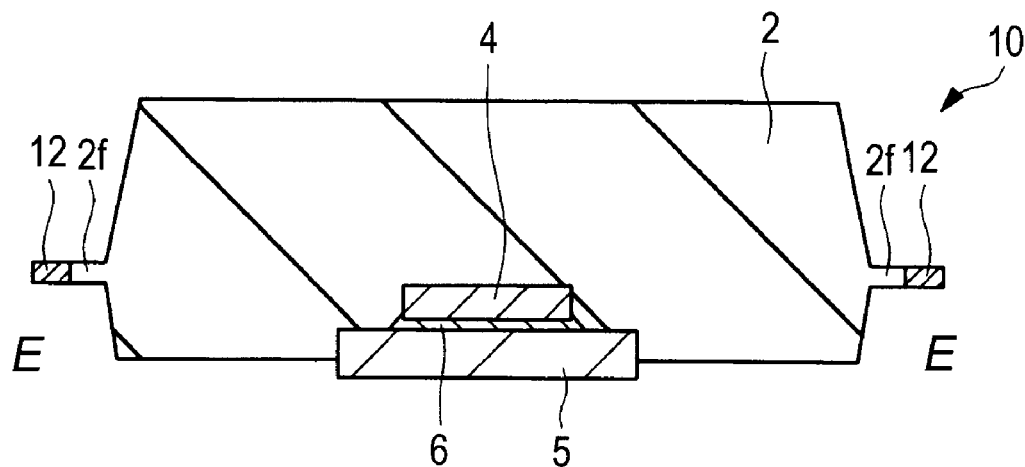
FIG. 14 is a sectional view taken on line E-E in FIG. 12.
Figure 15:
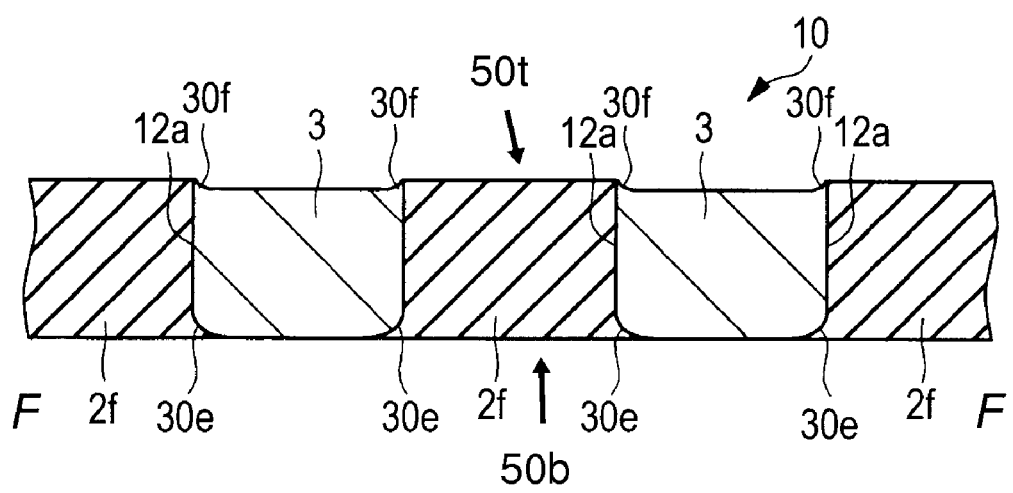
FIG. 15 is a sectional view taken on line F-F in FIG. 12.

After the above heat-curing step, the lead frame 10 is taken out from the interior of the molding die to afford a lead frame 10 having a main sealing body 2 formed in each device area 10a, as shown in FIGS. 12 to 15. FIG. 12 is a plan view of the lead frame 10 taken out from the interior of the molding die and FIGS. 13, 14, and 15 are sectional views taken on lines D-D, E-E, and F-F, respectively, in FIG. 12. In FIG. 13 there are shown sections of leads 3, in FIG. 14 there are shown sections of dam bars 12, and in FIG. 15 there are shown sections of leads 3 and intra-dam resin 2f.

In this embodiment, as shown in FIG. 11, resin is fed into the cavities 21b and 22b with the mold surfaces 21a and 22a contacting portions of the upper and lower surfaces of leads 3. Therefore, as shown in FIGS. 12 and 15, a secondary sealing body (intra-dam resin, resin between leads) 2f having oppositely facing first and second sides 50t, 50b, is formed in an area enclosed between adjacent leads 3 along the main sealing body 2 and between the main sealing body 2 and the dam bars 12 along the leads 3. Thus, a secondary sealing body 12f is present in each of the dam portions 12a as areas (resin accumulation areas) enclosed by the main sealing body 2 for sealing the semiconductor chip 4, a portion of leads 3 and the dam bars 12.

In many cases, after the step shown in FIGS. 12 to 15, the lead frame 10 formed with the main sealing body 2 is heat-treated (baked) in a baking furnace (not shown). In the baking step, the lead frame formed with the main sealing body 2 is disposed in a hot atmosphere heated to a temperature of about 150° C. and is heated therein for about 3 to 3.5 hours.

As shown in FIG. 15, like the lead frame 10 shown in FIG. 6, each lead 3 has depressions 30e at ends of its back surface and has burrs 30f at ends of its main surface. The back surface of each lead 3 is not uniformly flat, but has curvilinear depressions 30e at ends thereof, so in the regions where the depressions 30e shown in FIG. 15 are present, resin is injected also to lower portions of the lead 3 in the resin sealing step shown in FIG. 11 to form intra-dam resin 2f.

Figure 16:
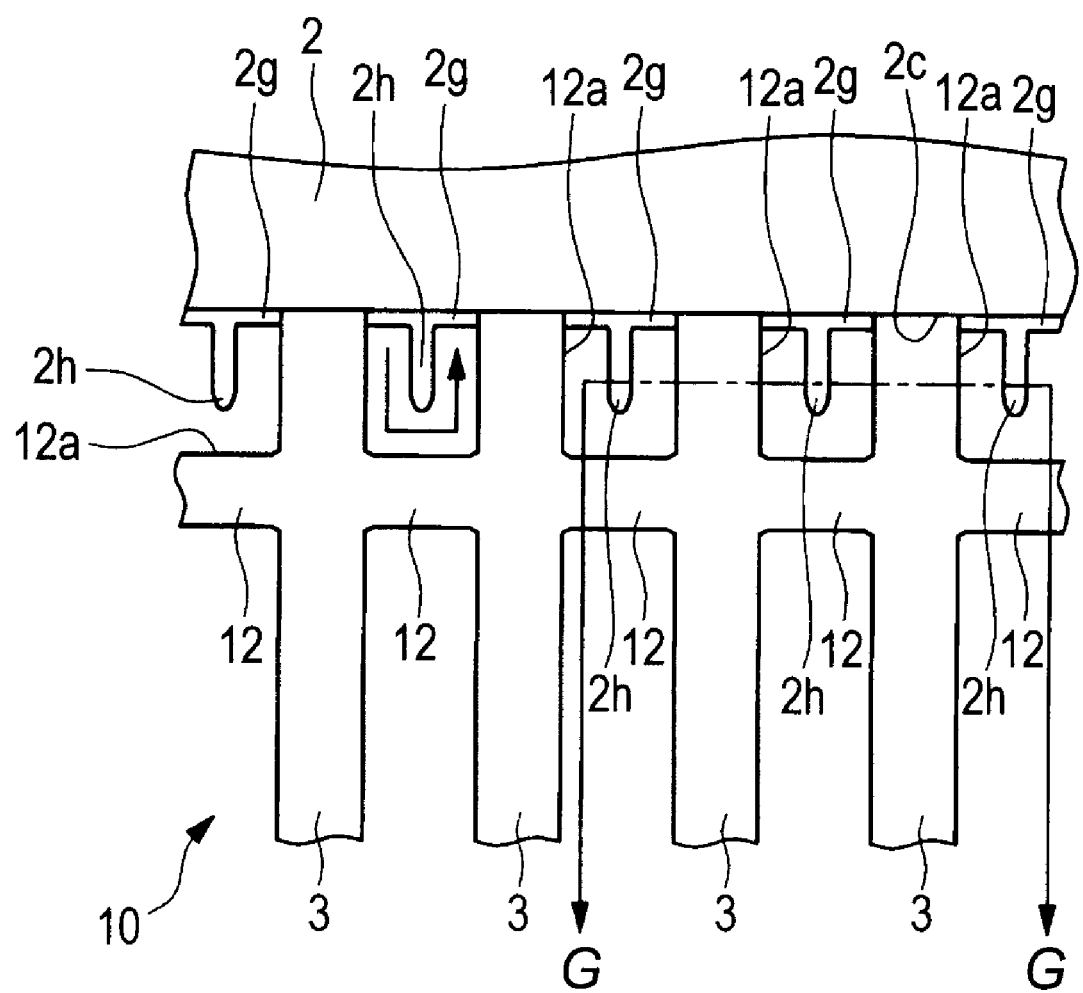
FIG. 16 is a plan view illustrating the semiconductor device manufacturing method which follows FIG. 12.

Next, as shown in FIG. 16, a laser beam is radiated to the intra-dam resin 2f from both main surface side and back surface side along a path defined by the arrow ("an arrowed path") to partially remove the intra-dam resin 2f. The arrowed path shown in FIG. 16 is a path extending along interfaces between side faces of leads 3, as well as a side face of the associated dam bar 12, and the intra-dam resin 2f. FIG. 16 is an enlarged plan view showing on a larger scale the vicinity of the side face 2c of the main sealing body 2 from which the leads are exposed.

In the step of removing the intra-dam resin 2f by the radiation of a laser beam, a laser beam is radiated to the intra-dam resin 2f shown in FIG. 15 while scanning the laser beam in the arrowed direction shown in FIG. 16 to remove the intra-dam resin 2f formed on side faces of the leads 3 and the associated dam bar 12. At this time, sealing body-side resin portion 2g having a width of about 70 μm in the illustrated example is formed in the interior of each dam portion 12a from the side face 2c of the main sealing body 2 toward the associated dam bar 12 to form a projecting resin portion 2h which extends from the side face 2c of the main sealing body 2 between adjacent leads 3 toward the dam bar 12. The sealing body-side resin portion 2g is resin which extends between adjacent leads 3 and on and along the side face 2c of the main sealing body 2 after a portion of the intra-dam resin 2f has been removed by the laser following the arrowed path. Thus, both the sealing body-side resin portion 2g and projecting resin portion 2h are formed from the intra-dam resin 2f. Though not shown, scanning of the laser beam is performed by adjusting the angle of a mirror in a laser device to shift a laser beam radiating position.

The laser beam scanning and radiating path is not limited to the arrowed direction shown in FIG. 16. Scanning may be done in a direction opposite to the arrowed direction. In this embodiment, within the arrowed path (turned square U-shaped path), the radiation of a laser beam is performed continuously without stop. After the radiation of a laser beam along the arrowed path is over, the laser beam radiation is stopped and the laser beam radiating position is shifted so as to straddle the lead 3 located closer to the radiation-stopped position, then within an adjacent dam portion 12a the laser beam is radiated in the same arrowed direction. In this way a plurality of portions of intra-dam resin 2f are removed in order.

The radiation of the laser beam may be performed so as not to leave either the sealing body-side resin portion 2g or the projecting resin portion 2h on the side face 2c of the main sealing body 2. However, it is desirable that the laser beam not be radiated to the main sealing body 2. In this embodiment, therefore, the sealing body-side resin portion 2g is allowed to remain to prevent the laser beam from being radiated to the main sealing body 2 even upon deviation of the laser beam position.

The sealing body-side resin portion 2g need not always be left. However, when the laser beam radiating position or the alignment position between the upper mold 21 and the lower mold 22 of the molding die 20 is dislocated, if the sealing body-side resin portion 2g is not formed, there is a fear that the laser beam may be radiated to a part of the main sealing body 2 shown in FIG. 16, with consequent burning of the main sealing body 2. For this reason it is preferable to leave behind the sealing body-side resin portion 2g.

In one embodiment, the radiation of a laser beam for removing the intra-dam resin 2f is performed a plurality of times. More specifically, the laser beam radiation to the intra-dam resin 2f is performed twice from the main surface side and also twice from the back surface side. By performing the laser beam radiation a plurality of times on each side, the laser beam radiation energy in a single radiation becomes relatively low, so that even if the laser beam strikes against the main sealing body 2, damage (burning) of the main sealing body 2 can be kept to a minimum.

The laser beam which is radiated is a YAG (yttrium aluminum garnet) laser beam having a frequency of 3 to 4 kHz, a current value of 16 A to 18 A and a moving speed (scan speed, feed speed) of 80 mm/sec. After two passes of the laser beam radiation under this condition for all the dam portions 12a from the main surface side of the lead frame 10, two passes of the laser beam radiation is performed for all the dam portions 12a from the back surface side of the lead frame 10. The laser beam is radiated as a spot having a range of about 25 μm in radius from the center of the laser beam-radiated site, namely, a spot of a circular range of about 50 μm in diameter. The foregoing current value of the laser beam is the value of an electric current which is supplied to a light source (e.g., arc lamp or laser diode) for exciting a medium of the YAG laser beam. By increasing the current value it is possible to increase the laser output.

Now, with reference to FIG. 16, a detailed description will be given about the laser beam radiation path. It is assumed that out of the opposed side faces of leads 3 adjacent to each other with a dam portion 12a therebetween, the side face of one lead can be considered a first side face and the opposed side face belonging to the adjacent lead can be considered a second side face.

First, the radiation of a laser beam to intra-dam resin 2*f* is started at a position along the first side face and near the main sealing body 2. While scanning the laser beam radiating position toward the associated dam bar 12 and in a first direction along the first side face, the laser beam is radiated to the intra-dam resin 2*f*. At this time, it is preferable to avoid too much radiation of the laser beam to the leads 3. Besides, since it is necessary to remove the intra-dam resin 2*f* formed on the first side face, the center of the laser beam radiating position must not neither too close to, nor too away from, the first side face.

Next, when the laser beam radiation approaches the dam bar 12, the laser beam scanning direction is changed to a second direction which is perpendicular to the first direction along the first side face and advances toward the second side face opposed to the first side face. The laser beam is radiated to the intra-dam resin 2*f* while scanning the laser beam along a side face of the dam bar 12 which is an interface between the dam bar 12 and the dam portion 12*a*. In this case, it is preferable that the distance from the side face of the dam bar 12 to the center of the laser beam radiating position be made equal to the distance between the first side face and the center of the laser beam radiating position in the laser beam radiation along the first side face of the lead 3.

Next, when the laser beam radiation along the side face of the dam bar 12 approaches the second side face, the laser beam scanning direction is changed to a third direction which is perpendicular to the second direction and extends along the second side face back toward the main sealing body 2. While scanning the laser beam radiating position from near the dam bar 12 toward the main sealing body 2, the laser beam is radiated. In this case, it is preferable that the distance from the second side face to the center of the laser radiating position be made equal to the distance between the first side face and the center of the laser beam radiating position in the laser beam radiation along the first side face.

Next, when the laser beam radiating position approaches the main sealing body 2, the laser beam radiation is stopped to terminate the laser beam radiating step in that one dam portion 12*a*. In the case where the laser beam is to be radiated plural times, the above operation is repeated by the number of times the laser beam is to be radiated.

Thereafter, in the stopped state of the laser beam radiation, the laser radiating position is shifted to a laser beam radiation start position of an untouched, new dam portion 12*a* adjacent to the dam portion 12*a* which has just been exposed to the laser beam. The same laser beam scan as in the above step is performed to remove the intra-dam resin 2*f* present within the new dam portion 12*a*. This operation is repeated to remove the intra-dam resin 2*f* in each dam portion 12*a*. In each dam portion 12*a*, the laser beam radiation in the path along the first side face, the side face of the dam bar 12 and the second side face is performed continuously.

The following description is now provided about the distance between the laser beam radiating position and a side face of each lead 3 or a side face of the associated dam bar 12.

It is preferable that the laser beam for removing the intra-dam resin 2*f* be radiated to a position spaced away from a side face of each lead 3 or a side face of the time bar 12, which are in contact with the dam portion 12*a*, at a distance within the radial range of the laser beam radiation spot.

In other words, the arrowed path shown in FIG. 16 is a path extending along the interfaces between side faces of leads 3, as well as a side face of the associated dam bar 12, and the intra-dam resin 2*f*, but since it suffices if the intra-dam resin 2*f* formed on the side faces of the leads 3 and dam bar 12 can be removed, it is preferable that the laser beam radiation be performed to a deviated position of the laser beam radiation center to the intra-dam resin 2*f* side from the interfaces.

A description will now be given while citing an example of using a laser beam having a radiation spot range of about 25 µm from the center of the laser beam radiating position. In this embodiment, the arrowed path shown in FIG. 16 advances along the side faces of leads 3 and dam bar 12 and is spaced away in a range of not more than about 25 µm in the direction of the intra-dam resin 2*f* from the side faces of the leads 3 and dam bar 12.

This is because if a laser beam is radiated using a radius that is too large, the intra-dam resin 2*f* is wholly removed, causing generation of a large amount of dust. Thus, for reducing the amount of dust produced and reducing the consumption energy of the laser beam, it is preferable that the laser beam radiation spot be limited to a radius of about 25 µm or smaller. Further, for removing the intra-dam resin 2*f* formed on the side faces of the leads 3 and dam bar 12, it is preferable that the laser beam radiating position be spaced away about 25 µm or less from the side faces of the leads 3 and dam bar 12 toward the intra-dam resin 2*f*.

By so doing, in comparison with the case where the laser beam radiation is performed while allowing the center of the laser beam radiation to be positioned at the foregoing interfaces, the laser beam radiation energy for the leads 3 becomes smaller, so that the intra-dam resin 2*f* formed on the side faces of the leads 3 and dam bar 12 can be removed while diminishing the likelihood of damage (scorching, burning) to the leads 3.

At this time, even if a small quantity of the laser beam is radiated to end portions of the upper or lower surfaces of the leads 3, there will arise no special problem in point of quality of the semiconductor device. As a result of the laser beam radiation along the arrowed path shown in FIG. 16, a trace (a radiation trace or a slight scorching trace) remains on the upper or lower surface of each lead 3 which has been exposed to the laser beam. This trace can be checked also after forming a plating film on the lead surface in the later plating step.

Figure 17A:
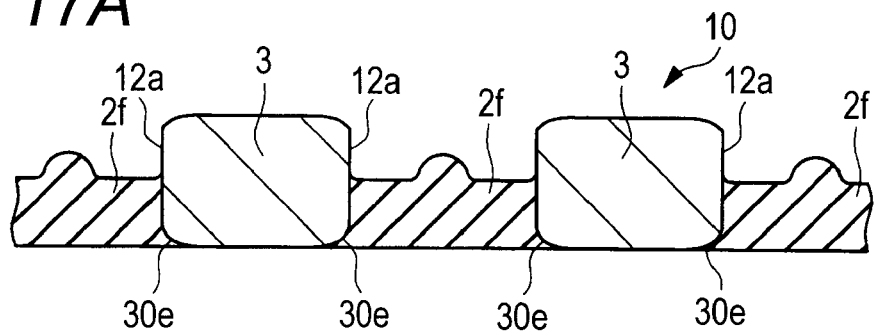
FIG. 17(a) is a sectional view illustrating the semiconductor device manufacturing method shown in FIG. 16
Figure 17B:
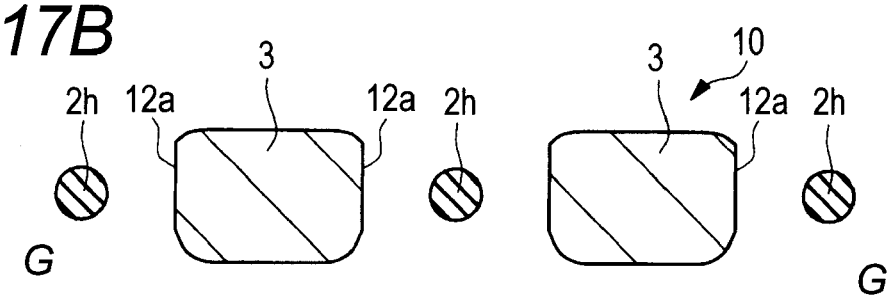
FIG. 17(b) is a sectional view taken on line G-G in FIG. 16.

The step of removing the intra-dam resin 2*f* by the laser beam radiation shown in FIG. 16 will now be described with reference to FIGS. 17(A) and 17(B). FIGS. 17(A) and 17(B) are sectional views at the same position as in FIG. 15, of which FIG. 17(A) is also a sectional view taken on line G-G in FIG. 16.

In the step of removing the intra-dam resin 2*f* by the laser beam radiation shown in FIG. 16, first, as shown in FIG. 17(A), a laser beam is radiated in the arrowed direction shown in FIG. 16 to the intra-dam resin 2*f* from the main surface side of the leads 3 to remove a half region on the main surface side of the intra-dam resin 2*f*. At this time, since a central part of the dam portion 12*a* is spaced away from the arrowed path (laser beam radiating path) shown in FIG. 16, the amount of the intra-dam resin 2*f* removed is small and a part of the intra-dam resin 2*f* which has not been removed remains in an upwardly raised state on the upper surface of the intra-dam resin 2*f*.

As shown in FIG. 17(A), end portions of the main surface of each lead 3 may partially be removed by laser beam radiation from the main surface direction of the lead 3. At this stage, an area along each side face of the lead, in a width range of 25 µm from the lead side face toward the lead center, is partially removed at a maximum depth of about 10 µm from the lead main surface toward the lead back surface by laser beam radiation.

Next, as shown in FIG. 17(B), a laser beam is radiated twice in the arrowed direction shown in FIG. 16 to the intra-dam resin 2*f* from the back side of the leads 3 to remove the remaining half of the intra-dam resin 2f. At this time, as in the step of radiating a laser beam from the main surface side, only a portion of the intra-dam resin 2f at the center of the dam portion 12a is removed. As a result, a projecting resin portion 2h is formed by (a) upwardly raised resin remaining on the upper surface of the intra-dam resin 2f after irradiation on the main surface side (See FIGS. 17(A)), and (b) central resin of the dam portion 12a remaining after irradiation on the back surface side (See FIG. 17(B).

As a result of the laser beam radiation from the back surface direction of the leads 3, the intra-dam resin 2f formed at lower portions of each lead 3 and on the surfaces of the depressions 30e in FIG. 17(a) is also removed. In this case, end portions of the back surface of the lead 3 may be partially removed by laser beam radiation. In the laser beam radiation being considered, as in the step described above in connection with FIG. 17(a), an area along the side face of the lead 3 in a width range of 25 μm toward the center of the lead 3 from the lead side face is partially removed at a maximum depth of about 10 μm in the main surface direction from the lead back surface by laser beam radiation.

In case of using the method which removes the dam bar 12 and the intra-dam resin 2f with use of a die punch or the method which removes the dam bar 12 and the intra-dam resin 2f by laser beam radiation as is disclosed in Patent Document 2, there has been the problem that resin remains on the side faces of leads 3 and causes a short-circuit between leads 3 in the completed semiconductor device.

In this embodiment, as described above in connection with FIG. 16, the intra-dam resin 2f on the side faces of leads 3 and the associated dam bar 12 can be removed without leaving any resin by radiating a laser beam to a path extending along the side faces of the leads 3 and dam bar 12. As a result, there no longer is generated any metallic burr of the plating film and hence it is possible to prevent the occurrence of a short-circuit caused by metallic burrs between leads 3.

In case of removing all the intra-dam resin 2f by radiating a laser beam to the whole internal area of the dam portion 12a as is disclosed in Patent Document 1 or in case of removing the intra-dam resin 2f together with the dam bar 12 as is disclosed in Patent Document 2, both methods require high energy laser beam radiation for removing the intra-dam resin 2f. Consequently, a foreign matter (soot) resulting from such high energy laser beam radiation adheres to the lead frame 10 or a high temperature is created, causing a change in quality of the lead frame 10, with consequent occurrence of the problem that a plating film may not be formed on the surface of the lead frame 10 in the later plating step.

In this embodiment, since a laser beam is radiated to only the path extending along the side faces of leads 3 and dam bar 12, the laser beam radiation does not require an energy level high enough to remove all the intra-dam resin and hence it is possible to prevent the change in quality caused by the occurrence of a foreign matter and by heating of the lead frame 10.

Further, the method disclosed in Patent Document 1 or 2 has involved the problem that the laser beam radiation for removing the intra-dam resin is performed from only the main surface side of the lead frame. Thus, the laser beam is not radiated on the back side to the intra-dam resin 2f formed at lower portions of the leads 3 shown in FIG. 15, and so not all the intra-dam resin 2f is removed and this causes a short-circuit between leads 3 when coming off the leads 3.

In this embodiment, as described above in connection with FIGS. 16, 17(a) and 17(b), a laser beam is radiated from both main surface and back surface sides of the leads 3, so that the laser beam is radiated also to the intra-dam resin 2f formed at lower portions of the leads 3 shown in FIG. 15, thus making it possible to remove the intra-dam resin 2f completely while allowing the sealing body-side resin portion 2g and the projecting resin portion 2h to remain. That is, in this embodiment, by radiating a laser beam from the back surface side of the lead frame 10 where the depressions 30e shown in FIG. 6 are present, it is possible to remove the intra-dam resin 2f formed on side faces and lower portions of the leads 3 and on the side face of the dam bar 12. Thus, the intra-dam resin 2f is not allowed to remain on the surfaces of the leads 3. As a result, metallic burrs of the plating film between leads 3, which are caused by peeling-off of the intra-dam resin 2f, are no longer formed. Therefore, it is possible to prevent the occurrence of a short-circuit caused by metallic burrs between leads 3, thus making it possible to improve the reliability of the semiconductor device 1.

In a certain type of a semiconductor device, a copper plate is punched from an upper surface toward a lower surface of the same plate with a die punch. In this case, curvilinear depressions are formed at end portions of the lead main surface. Therefore, when the intra-dam resin formed on the surfaces of the depressions is to be removed, it is important that a laser beam be radiated from the main surface side rather than from the back surface side. That is, in the present invention, it is important that a laser beam be radiated from the side having curvilinear depressions at end portions, which side is either the main surface or the back surface of each lead 3.

In this embodiment it is not that a laser beam is radiated once from the main surface side and once from the back surface side of each lead 3, but a laser beam is radiated twice from the lead main surface side and twice from the lead back surface side. That is, a laser beam is radiated plural times from each of the main surface side and the back surface side of each lead 3. This is because in case of removing resin with use of a laser beam, the resin exposed to the laser beam is crushed and if a laser beam is radiated only once at strong radiation energy to remove the intra-dam resin 2f, the crushed resin scatters as a foreign matter to the environs (especially to the vicinity of the laser beam radiated site). In this case, the foreign matter adheres as soot to the surface of the associated lead 3.

At this time the laser beam radiated site becomes high in temperature. The vicinity of the laser beam radiated site also assumes a somewhat heated state. Consequently, the vicinity of the intra-dam resin on the lead 3 assumes a heated state and the foreign matter (soot) adhered to the lead surface becomes fixed. If the amount (volume) of the resin removed by the laser beam is large, the amount of the foreign matter (soot) deposited on the lead surface also becomes large. As a result, not only the treatment time required in a later washing step becomes longer, but also, in some cases, there arises the problem that the foreign matter fixed onto the lead surface (a foreign matter portion positioned on the lead surface side (lower layer) of the deposited foreign matter) cannot be removed completely and a plating film is not formed on the surface of the lead frame 10 in a later plating step, or even if a plating film is formed, it peels very easily.

Having made a study on this point, the present inventors found out that the laser beam radiating frequency be preferably lower than 5 kHz. In this embodiment, the radiation of a laser beam under the condition of a frequency of 3 to 4 kHz, a current value of 16 A to 18 A is performed plural times from the main surface side and plural times also from the back surface side of each lead 3.

Even if the projecting resin portion 2h is formed on the side face 2c of the main sealing body 2, there arises no problem because it suffices if the intra-dam resin 2f formed on side faces of leads 3 and dam bar 12 can be removed. Moreover, in comparison with the case where all the intra-dam resin 2f within each dam portion 12a is removed, since a laser beam is radiated to only the portion extending along side faces of leads 3 and dam bar 12, it is possible to make the laser beam radiation time shorter and hence possible to shorten the time required for manufacturing the semiconductor device.

In case of removing all the intra-dam resin 2f, the amount of dust (foreign matter) produced upon radiation of a laser beam to the intra-dam resin 2f increases, so that, as noted above, the reliability of a plating film formed in the plating step for each lead 3 is deteriorated. Therefore, it is preferable to set the laser beam energy level to low, or to narrow the size of the laser beam radiation spot, thereby removing only the resin present on side faces of leads 3 and dam bar 12 and allowing the projecting resin portion 2h to remain.

That is, in point of reliability and manufacturing cost of the semiconductor device, radiating a laser beam so as to leave the projecting resin portion 2h is advantageous over removing all the intra-dam resin 2f without allowing the projecting resin portion 2h to remain. Thus, in one embodiment of a semiconductor device of the present invention, a plurality of remaining projecting resin portions 2h project outwardly from the main sealing body 2, at a location between adjacent leads 2, to a distance less than the distance to where the bar 12 was located.

Figure 18:
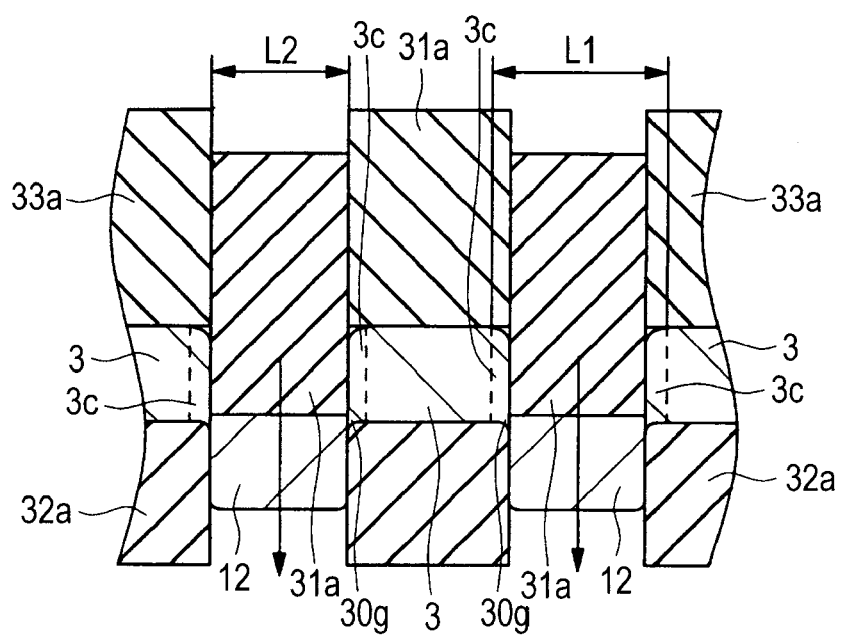
FIG. 18 is a sectional view illustrating the semiconductor device manufacturing method which follows FIG. 17.

Next, as shown in FIG. 18, the lead frame 10 is inverted so that its main surface faces down, and then it is installed between a die punch guide 33a and a die 32a. Subsequently, with a die punch (cutting edge) 31a, the dam bar 12 between adjacent leads 3 out of the plural leads 3 is removed by punching in the arrowed direction shown in FIG. 18 and the lead frame 10 is inverted so that its main surface again faces up to afford the lead frame 10 shown in FIG. 19. Thereafter, the lead frame 10 is washed in a washing step to remove t2h he foreign matter adhered to the lead surfaces. As a result, of the plural leads 3, one lead 3 and another lead 3 are electrically separated from each other. At this time, in the step shown in FIG. 18, the dam bar 12 is removed and the projecting resin portion 2h is cut off by the die punch (cutting edge) 31a and thus the resin 2h is also removed.

Figure 19:
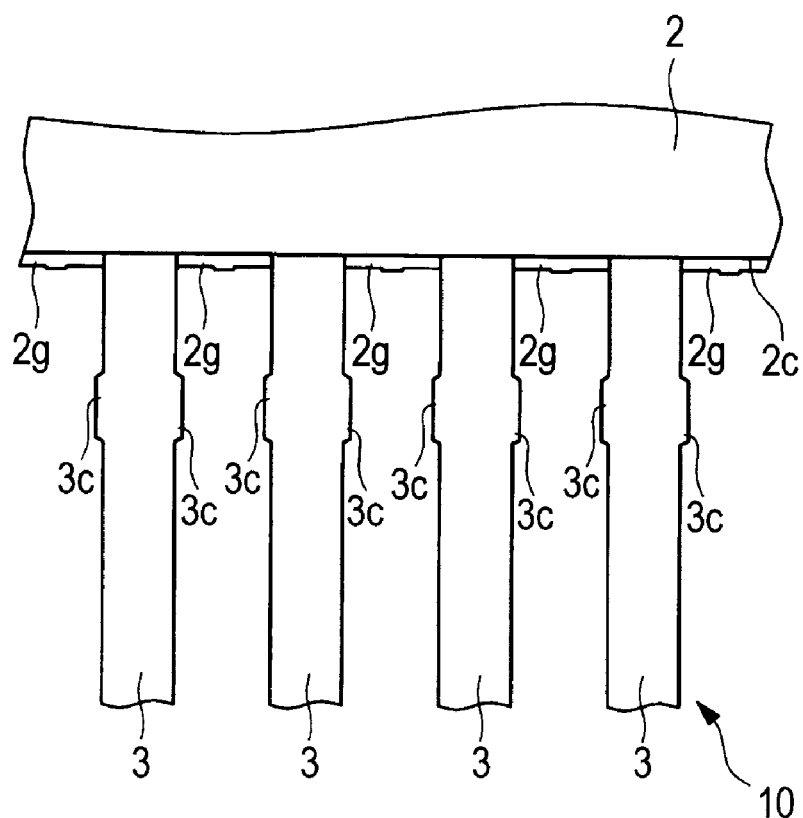
FIG. 19 is a plan view illustrating the semiconductor device manufacturing method which follows FIG. 18.

FIG. 18 is a sectional view including leads 3 and protuberances 3c in a plane along the extending direction of die bars 12, in which broken lines indicate side face positions of the leads 3. Protuberances 3c formed between side faces of a lead 3 and side faces of other leads 3, which are indicated by broken lines, are residual dam bars formed by cutting dam bars 12 formed on the lead frame 10. FIG. 19 is a plan view of the lead frame 10 after removal of the dam bars 12 and the projecting resin portion 2h.

In the step shown in FIG. 18, the dam bars 12 are punched off from the back surface (the upper surface of the lead frame 10 in FIG. 18) toward the main surface (the lower surface of the lead frame 10 in FIG. 18) of the lead frame 10 by the die punch 31a. Therefore, in FIG. 18, in the section of each lead 3 after cutting off dam bars 12, burrs 30g are formed projectingly downwards from the main surface of the lead 3. When forming the lead frame 10 with use of the die punch, as described above in connection with FIG. 6, a part of the copper plate 30 (see FIG. 4) is punched from the back surface toward the main surface of the lead frame 10 to avoid a packaging defect caused by burrs 30f.

However, as shown in FIG. 13, the leads 3 are floating portions higher than the lower surface of the chip mounting portion 5 which is at the lowest position of the lead frame 10. Particularly, the area where the dam bars 12 shown in FIG. 16 were formed lies at a higher position than the lowest area of the lead frame 10 even after the subsequent lead bending step.

That is, the area in which the dam bars 12 are formed is not an area that comes into contact with a wiring substrate at the time of mounting the semiconductor device, so even if burrs are projected downwards at the back surface of the leads, there arises no problem. Therefore, in the step of cutting each dam bar 12, the dam bar 12 shown in FIG. 16 may be punched off from the upper surface side toward the lower surface side of leads 3. In this case, it is not necessary to dispose the lead frame 10 onto the die 32a shown in FIG. 18 in such a manner that its main surface faces down, but with the main surface of the lead frame 10 up, the lead frame is disposed onto the die 32a and punching is performed from the main surface side toward the back surface side by the die punch 31a.

The projecting resin portion 2h is a thin rod-like resin, and when the die punch 31a is pushed against it, the base portion of the projecting resin portion 2h breaks easily at a position close to the main sealing body 2 and the resin 2h separates from the main sealing body 2 and comes off. Therefore, as compared with the method disclosed as a subject matter in Patent Document 1 wherein almost all the intra-dam resin 2f is crushed and removed with a die punch, the method adopted in this embodiment permits the use of weak pressure to remove the resin remaining in the dam, so that it is possible to prevent wear of the die punch 31a itself and reduce the semiconductor device manufacturing cost.

The die punch 31a used in the cutting step for each dam bar 12 in this embodiment has a cutting edge of a width L2 thinner (smaller) than the distance (spacing) L1 between adjacent leads 3, as shown in FIG. 18. This is because a positional deviation of the die punch 31a relative to the lead frame 10 is taken into account and there accrues an effect of suppressing partial contact of the die punch 31a with the lead 3. Consequently, as shown in FIG. 19, protuberances (residual dam bars) 3c as residues of the dam bars 12 are formed on side faces of the leads 3 having gone through the dam bar cutting step, as shown in FIG. 19.

There also is a method wherein a dam bar 12 is removed simultaneously with removal of the intra-dam resin 2f in the intra-dam resin removing step using the radiation of a laser beam described previously in connection with FIG. 16. According to this method, however, a laser beam of high energy is radiated to the intra-dam resin 2f. In this embodiment, therefore, in order to prevent the occurrence of the foregoing plating defect, the intra-dam resin 2f removing step and the dam bar 12 removing step are made separate and the removal of each dam bar 12 is performed using the die punch.

In the washing step for the lead frame 10, the foreign matter (soot) adhered to the surfaces of the leads 3 which are exposed from the main sealing body 2 is removed. More specifically, first a workpiece (in this embodiment the lead frame 10 shown in FIG. 19) is disposed within a bath containing electrolyte and is coupled to an anode in the bath. Then, DC voltage is applied between the anode and a cathode also disposed within the bath to uncouple the foreign matter adhered to the surface of the workpiece (here the surfaces of leads 3) and the workpiece from each other. In this way it is possible to remove the foreign matter adhered to the lead surfaces. Thereafter, the lead frame 10 is washed with washing water. The washing water used in this embodiment is, for example, water commonly used, more particularly, the tap water (city water).

Figure 20:
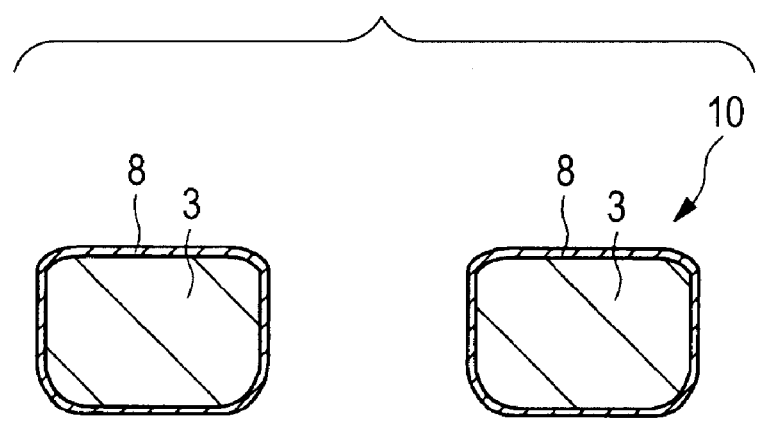
FIG. 20 is a plan view illustrating the semiconductor device manufacturing method which follows FIG. 19.

Next, as shown in FIG. 20, a plating film 8 is formed on the surface of each lead 3 exposed from the main sealing body 2. FIG. 20 is a sectional view of lead 3 in an area closer to the main sealing body 2 than the protuberances 3c, which sectional view is of the leads 3 at the same position as in FIG.

17(b). The thickness of the plating film 8 can be between 7 to 18 μm and is more preferably 10 to 12 μm.

In the step for plating the surfaces of the leads 3 exposed from the main sealing body 2, first the workpiece (in this embodiment the lead frame 10 shown in FIG. 19) is disposed within a plating tank containing a plating solution and is then coupled to a cathode disposed within the plating tank. Then, DC voltage is applied between the cathode and an anode also disposed within the plating tank to form a plating film 8 on the workpiece (the surfaces of leads 3). That is, in this embodiment, the plating film 8 is formed by the so-called electrolytic plating method.

The plating film 8 used in this embodiment is formed of so-called lead-free solder substantially containing no Pb (lead). For example, it is a film of Sn (tin) alone, Sn (tin)-Bi (bismuth), or Sn (tin)-Ag (silver)-Cu (copper). By the lead-free solder is meant solder having a Pb (lead) content of 0.1 wt % or less. This content is defined as a standard of RoHs (Restriction of Hazardous Substances) Instructions.

Therefore, in the plating solution used in this plating step is contained a metal salt such as, for example, $Sn^{2+}$ or $Bi^{3+}$. Although in this embodiment a description will be given about an alloyed metal plating of Sn—Bi as an example of lead-free solder plating, the Bi may be replaced with such metals as Cu or Ag.

In this embodiment, as shown in FIG. 16, a laser beam is radiated to the intra-dam resin 2f to remove the intra-dam resin 2f without any residual resin left on the side faces of leads 3. In this plating step, therefore, the side faces of leads 3 in an area closer to the main sealing body 2 than the protuberances 3c shown in FIG. 19 are coated with the plating film 8.

In the lead frame 10 used in this embodiment, a plating film (not shown) of Ni is formed on the surface of a substrate material, such as copper. In the intra-dam resin removing step using the radiation of a laser beam or in the dam bar cutting step both described above, the substrate material is exposed at the laser beam radiated site or in the cut face of the associated dam bar. In such an exposed state of the substrate material, corrosion of leads 3 may result from the exposed surface, causing deterioration of the reliability of the semiconductor device.

However, in this embodiment, as described above, since the plating film 8 can be formed also on side faces of leads 3 and the opposed side faces of protuberances 3c, it is possible to prevent corrosion of the lead 3 and thereby improve the reliability of the semiconductor device.

According to this embodiment it is possible to coat with the plating film 8 the side faces of each lead at the area closer to the main sealing body 2 than the protuberances 3c independently of the kind of the material used to form the lead frame 10. Thus, it is possible to use various other materials than the above material, such as, for example, the material called 42 Alloy which is an alloy of iron (Fe) and nickel (Ni), a copper frame not formed with a plating film of Ni.

Next, as shown in FIG. 2, the connections of the leads 3 coupled to the frame (frame portion) 10b (not shown) of the lead frame are cut and thereafter the leads 3 are subjected to bending.

The leads 3 are bent in the following manner. First, the leads coupled integrally with the frame 10b (not shown) are cut at their connections and are thereby made independent members respectively (lead cutting step). In this lead cutting step, for example a die (support member) is disposed on the lower surface side of the lead frame 10 and a punch (cutting edge) is disposed on the upper surface side of the lead frame, followed by pressing to cut off the leads 3 from the frame 10b.

Next, as shown in FIG. 2, the leads 3 after the cutting are subjected to bending (bending process). In this embodiment, the leads are formed in a gull wing shape. As shown in FIG. 2, an end portion of each lead 3 thus cut by pressing work has a generally flat section and is exposed at its section from the plating film 8. In the bending step, the pressing work is carried out using three dies (support members) and a punch (pressing member) to bend each lead 3.

According to this embodiment, in the intra-dam resin removing step shown in FIG. 16, the intra-dam resin 2f is removed by the radiation of a laser beam without leaving any resin on the side faces of leads 3. If the intra-dam resin remains on the side faces of leads 3, stress induced at the time of performing the bending work for the leads 3 is transmitted to the residual resin remaining on the side faces of leads 3, with consequent likelihood of the residual resin being destroyed. In this case, broken chips of the destroyed residual resin drop for example onto the bending die, causing a morphological defect or the like of the lead to be next subjected to the forming work. Further, in the event of adherence of a dropped chip to the lead 3, it may become a foreign matter and cause a packaging defect when mounting the semiconductor device.

According to this embodiment, however, since the residual resin on the side faces of leads 3 can be removed positively as described above, it is possible to prevent the occurrence of a morphological defect of the lead 3 to be next subjected to the forming work or a packaging defect of the semiconductor device.

Next, suspending leads 11 (not shown) coupled to the frame 10b (see FIG. 5) are cut for package dicing device area 10a to form the semiconductor device 1. The suspending leads 11 are cut for example by pressing with use of a die (support member) and a punch (cutting edge) disposed on the lower surface side and the upper surface side, respectively, of the lead frame 10. In this way the semiconductor device 1 of this embodiment shown in FIGS. 1 and 2 is completed.

In the case of the semiconductor device 1 of this embodiment, a laser beam is radiated along side faces of leads 3 and a side face of the associated dam bar 12, whereby the intra-dam resin 2f formed on the side faces of leads 3 and dam bar 12 can be removed positively without leaving any resin. Therefore, it is possible to prevent the occurrence of a short-circuit between leads 3, the short-circuit being caused by metal burrs of the plating film which are attributable to peeling-off of the residual resin formed on side faces of leads 3 or at lower portions of the leads 3 after the lead plating step. This can improve the reliability of the semiconductor device 1. Moreover, since the laser beam radiation is performed also from the back surface side of leads 3, the intra-dam resin 2f formed at lower portions of the leads 3 can also be removed without leaving any resin.

By radiating a laser beam a plurality of times using a lowered laser beam radiation energy level, it is possible to prevent scattering of a foreign matter and a change in quality of the lead frame 10, both being caused by the radiation of a laser beam. Hence, it is possible to improve the reliability of the plating film formed on the surface of the lead frame. Using a plurality of laser beam radiations in which the energy in a single laser beam radiation is relatively low, even if a laser beam strikes against the main sealing body 2, it is possible to avoid damage to the main sealing body.

Moreover, by preventing damage by the die punch and avoiding packaging defects caused by falling of the residual resin 2i, it is possible to improve the reliability of the semiconductor device 1.

Further, by preventing wear of the die punch and narrowing the laser beam radiation range it is possible to reduce the cost of manufacturing the semiconductor device 1.

Although the present invention has been described above concretely on the basis of an embodiment thereof, it goes without saying that the present invention is not limited to the above embodiment, but that various changes may be made within the scope not departing from the gist of the invention.

For example in the above embodiment a description has been given about an SOP (Small Outline Package) type semiconductor device wherein the lead frame 10 is partially exposed (projected) from the two side faces 2c out of the four sides of the main sealing body 2 which is quadrangular in plan as shown in FIG. 1 and also from the lower surface (back surface, packaging surface) of the main sealing body 2. However, no limitation is made to the two side faces from which the leads are exposed, but the present invention is applicable also to a QFP (Quad Flat Package) type semiconductor device wherein leads are exposed from all the sides (four sides) of the main sealing body.

Figure 21:
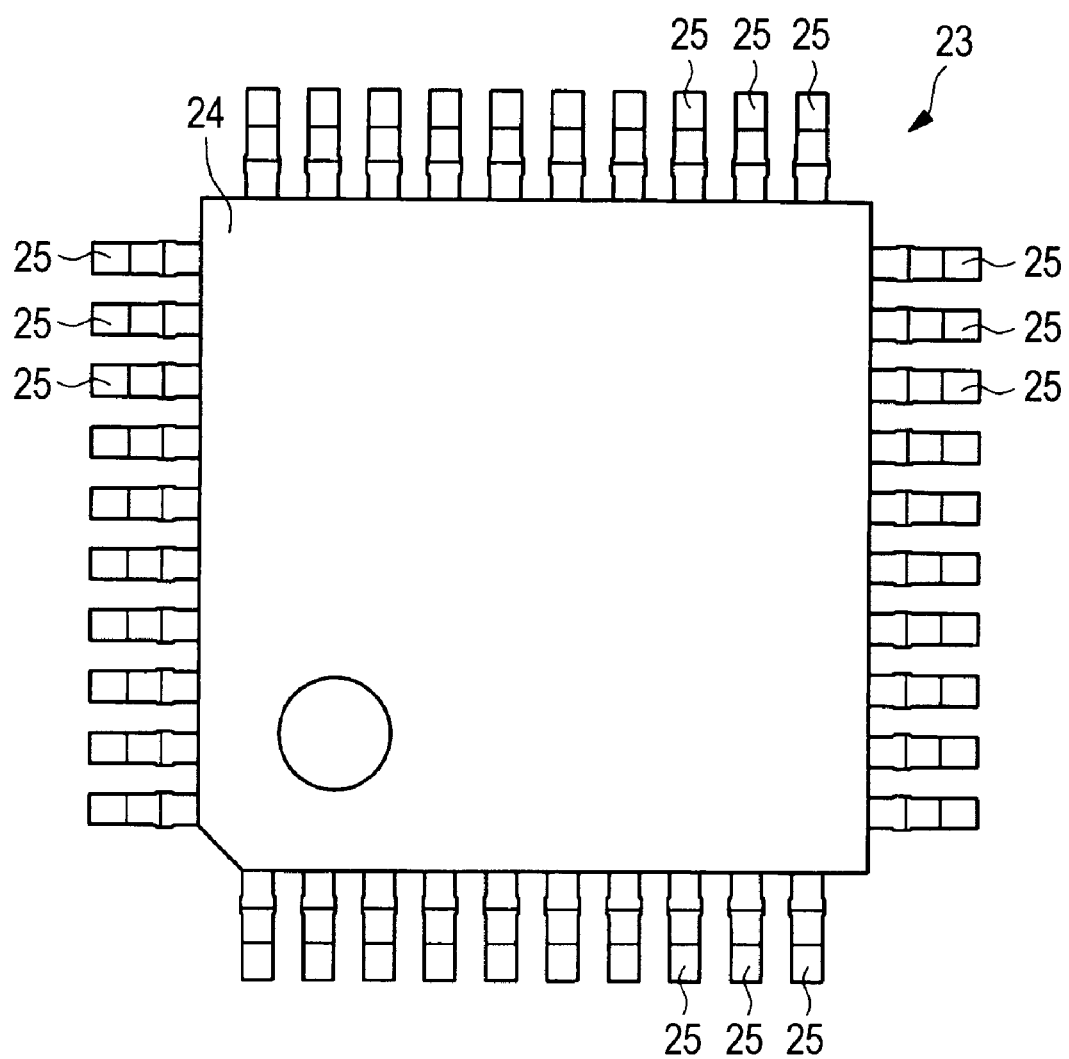
FIG. 21 is a plan view of a semiconductor device according to another embodiment of the present invention.
Figure 22:
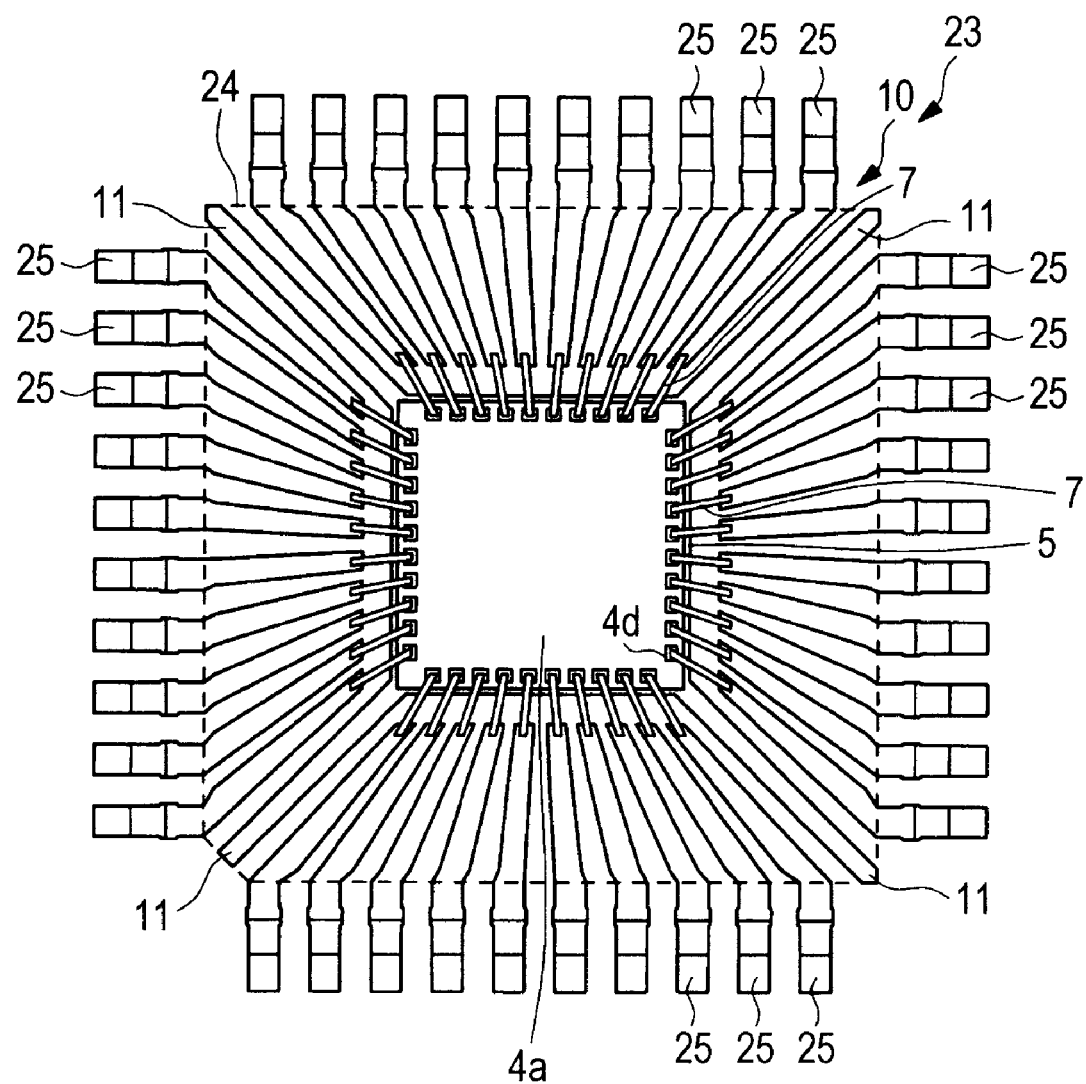
FIG. 22 is also a plan view of the semiconductor device of FIG. 21.
Figure 23:
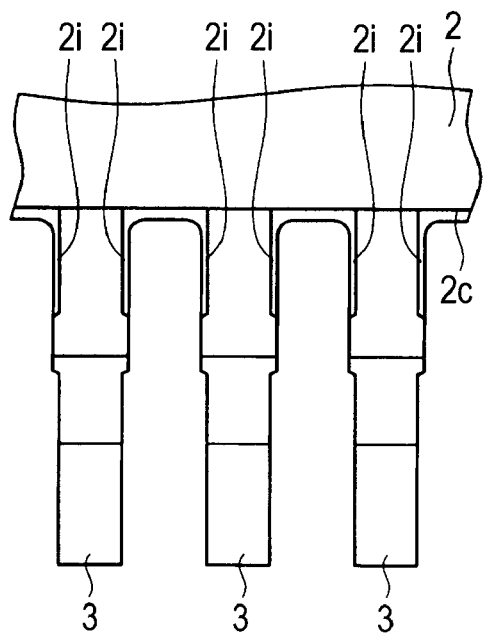
FIG. 23 is a plan view of a principal portion of a semiconductor device according to a conventional technique.

An example is shown in FIGS. 21 and 22 in which the present invention is applied to a QFP type semiconductor device 23 with leads projecting from all the sides of a main sealing body. FIG. 22 is a plan view showing the semiconductor device 23 through a main sealing body 24 shown in FIG. 21, in which the profile of the main sealing body 24 is indicated with a broken line. As shown in FIGS. 21 and 22, a semiconductor chip 4a is mounted on a chip mounting portion 5 of a lead frame 10, the lead frame 10 having the chip mounting portion 5, suspending leads 11 and a plurality of leads 25. A plurality of electrode pads 4d are formed on an upper surface of the semiconductor chip 4a so as to be arranged along the four sides of the semiconductor chip 4a. The electrode pads 4d are electrically coupled to the leads 25 respectively through plural conductive members 7. The leads 25 are exposed from the four sides of the main sealing body 24.

Also in the QFP type semiconductor device 23, as in the previous embodiment, resin is formed within dams in the semiconductor device manufacturing process. By removing this intra-dam resin with use of a laser beam and in accordance with the same method as the method illustrated in FIG. 16, it is possible to prevent the occurrence of a short-circuit between leads 25.

Figure 28:
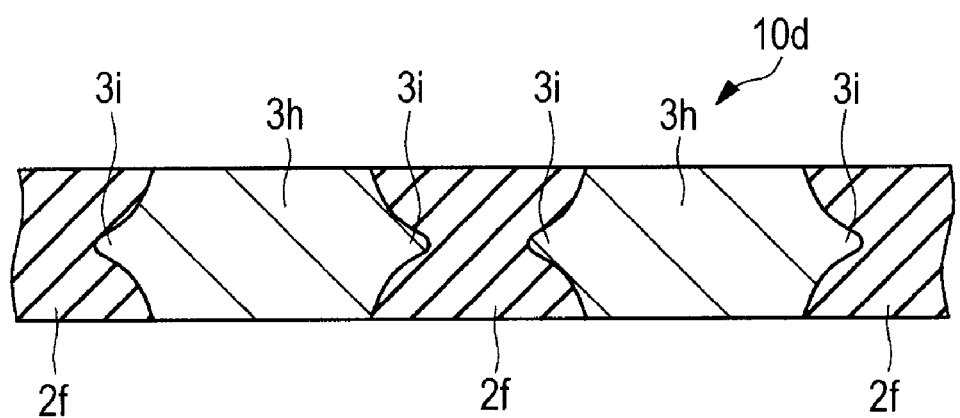
FIG. 28 is a sectional view illustrating a semiconductor device manufacturing method.

Although in the previous embodiment reference has been made to an example in which the lead frame 10 is a press frame, no limitation is made thereto. The present invention is applicable also to a semiconductor device using an etching frame 10d shown in FIG. 28. In case of using the lead frame (etching frame) 10d, projections 3i are present on side faces between upper and lower surfaces of the lead frame 10d and resin is apt to remain above and below the projections 3i. In this case, the radiation of a laser beam from both upper and lower surfaces of the lead frame 10d is effective in removing the intra-dam resin 2f.

The present invention is applicable to a semiconductor device wherein leads as external terminals are projected from a main sealing body which is for sealing a semiconductor chip.

What is claimed is:

1. A method for manufacturing a semiconductor device having a main sealing body for sealing a semiconductor chip and a plurality of leads exposed from the main sealing body, the method comprising the steps of:
   (a) providing a semiconductor package including: the main sealing body for sealing the semiconductor chip; the leads exposed from the main sealing body; dam bars formed integrally with the leads; and at least one secondary sealing body formed in an area enclosed by the main sealing body, the leads and the dam bars;
   (b) radiating a laser beam to the secondary sealing body to remove at least a portion of the secondary sealing body, the laser beam being radiated along a path extending along side faces of the leads and side faces of the dam bars which are in contact with the secondary sealing body;
   (c) after the step (b), removing a portion of the dam bars; and
   (d) after the step (c), forming a plating film over a surface of each of the leads.

2. The method according to claim 1, wherein, in the step (b), the laser beam is radiated to the secondary sealing body from a main surface side of the leads or a back surface side of the leads opposite to the main surface side, whichever side includes a surface having curvilinearly depressed end portions.

3. The method according to claim 1, wherein, in the step (b), the laser beam radiation to the secondary sealing body is performed from both a main surface side and a back surface side of the leads.

4. The method according to claim 1, wherein, in the step (b), the laser beam radiation to the secondary sealing body is performed a plurality of times from both the main surface side and the back surface side of the leads.

5. The method according to claim 1, wherein, in the step (b), the laser beam radiation to the secondary sealing body is performed a plurality of times.

6. The method according to claim 1, wherein the laser beam radiation in the step (b) is performed at a frequency of 3 to 4 kHz and a current value of 16 A to 18 A.

7. The method according to claim 1, wherein the laser beam radiated in the step (b) is a YAG laser beam.

8. The method according to claim 1, wherein, in the step (b), the secondary sealing body is not allowed to remain on the side faces or lower portions of the leads.

9. The method according to claim 1, wherein, in the step (b), the secondary sealing body is removed from the side faces of the leads and also from lower portions of the leads.

10. The method according to claim 1, wherein, in the step (b), a sealing body-side portion remains after the secondary sealing body is partially removed, the sealing body-side portion extending between the leads and along a side face of the main sealing body.

11. The method according to claim 1, wherein, in the step (b), a projecting portion remains after the secondary sealing body is partially removed, the projecting portion projecting from a side face of the main sealing body toward the dam bars.

12. The method according to claim 11, wherein, in the step (c), the projecting portion is removed together with removal of the dam bars.

13. The method according to claim 1, wherein, in the step (c), the dam bars are partially removed using a cutting edge.

14. The method according to claim 13, wherein the dam bars are partially removed using a cutting edge having a cutting width smaller than a distance between adjacent leads.

15. A semiconductor device manufactured in accordance with the method of claim 1.

16. A method for removing at least a portion of a secondary sealing body formed on a semiconductor package, the secondary sealing body having oppositely facing first and second sides,
   the semiconductor package comprising:
      a main sealing body;

a plurality of leads exposed from the main sealing body, including adjacent first and second leads having respective opposing first and second side faces, and dam bars formed integrally with the leads, wherein the secondary sealing body is located in an area enclosed by the main sealing body, said opposing first and second side faces, and an associated dam bar;

the method comprising:
- (a) directing a laser beam to a location within the secondary sealing body that is proximate the first side face and also the main sealing body;
- (b) radiating the secondary sealing body while scanning the laser beam in a first direction along the first side face, away from the main sealing body and towards the associated dam bar;
- (c) radiating the secondary sealing body while scanning the laser beam in second direction, along the associated dam bar, away from the first side face and towards the second side face; and
- (d) radiating secondary sealing body while scanning the laser beam in a third direction along the second side face, away from the associated dam bar and towards the main sealing body;

whereby at least a portion of the secondary sealing body is removed.

17. The method according to claim 16, comprising:
performing steps (a) to (d) on both the first and second sides of the secondary sealing body; whereby:
a sealing body-side portion extending between the first and second leads and along a side face of the main sealing body, remains; and
a projecting portion projecting from the side face of the main sealing body toward the associated dam bar, remains.

18. The method according to claim 17, wherein:
performing steps (a) to (d) on both the first and second sides of the secondary sealing body removes secondary sealing body material occupying curvilinear depressions formed in one or more leads.

19. The method according to claim 16, comprising:
performing steps (a) to (d) at least twice on both the first and second sides of the secondary sealing body; whereby:
a sealing body-side portion extending between the first and second leads and along a side face of the main sealing body, remains; and
a projecting portion projecting from the side face of the main sealing body toward the associated dam bar, remains.

20. A semiconductor device manufactured in accordance with the method of claim 16.

* * * * *